United States Patent
Namkung

(10) Patent No.: US 10,115,913 B2
(45) Date of Patent: Oct. 30, 2018

(54) DISPLAY APPARATUS

(71) Applicant: SAMSUNG DISPLAY CO., LTD., Yongin-si, Gyeonggi-do (KR)

(72) Inventor: Jun Namkung, Yongin-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/384,350

(22) Filed: Dec. 20, 2016

(65) Prior Publication Data

US 2017/0294609 A1    Oct. 12, 2017

(30) Foreign Application Priority Data

Apr. 8, 2016    (KR) .................. 10-2016-0043512

(51) Int. Cl.
   *H01L 51/00*    (2006.01)
   *H01L 27/32*    (2006.01)
   *H01L 51/52*    (2006.01)

(52) U.S. Cl.
   CPC ...... *H01L 51/0097* (2013.01); *H01L 27/3244* (2013.01); *H01L 51/5253* (2013.01); *H01L 27/3276* (2013.01); *H01L 51/5246* (2013.01); *H01L 2251/5338* (2013.01); *Y02E 10/549* (2013.01)

(58) Field of Classification Search
   None
   See application file for complete search history.

(56) References Cited

U.S. PATENT DOCUMENTS 9,214,640 B2    12/2015 Lee et al.
9,274,559 B2    3/2016 Prushinskiy et al.
2012/0307423 A1* 12/2012 Bohn ................. G06F 1/1641
                                                  361/679.01
2014/0042406 A1* 2/2014 Degner ............... H01L 27/326
                                                  257/40
2014/0240985 A1* 8/2014 Kim .................. H05K 1/028
                                                  362/249.04
2015/0263301 A1    9/2015 Namkung et al.
2016/0014883 A1    1/2016 Cho et al.
2016/0093644 A1* 3/2016 Ki .................. H01L 29/78672
                                                  257/40
2016/0172623 A1* 6/2016 Lee .................. H01L 51/5253
                                                  257/40

FOREIGN PATENT DOCUMENTS

KR    10-2013-0076402 A    7/2013
KR    10-2014-0085956 A    7/2014
KR    10-2014-0108914 A    9/2014

* cited by examiner

*Primary Examiner* — Lex Malsawma

(74) *Attorney, Agent, or Firm* — Lee & Morse, P.C.

(57) ABSTRACT

A display apparatus is disclosed. The display apparatus includes a substrate, a display, and a protective film. The substrate includes a bending area between a first area and a second area and is bent about a bending axis. The display is over an upper surface of the substrate in the first area. The protective film is over a lower surface of the substrate. The protective film includes a first protective film base over the lower surface of the substrate and corresponding to at least a part of the first area, and a first adhesive layer between the substrate and the first protective film base. The first protective film base includes a first thick portion having a first thickness and a first thin portion having a second thickness less than the first thickness and is closer to the bending area than the first thick portion.

20 Claims, 21 Drawing Sheets

DISPLAY APPARATUS

CROSS-REFERENCE TO RELATED APPLICATION

Korean Patent Application No. 10-2016-0043512, filed on Apr. 8, 2016, and entitled, "Display Apparatus," is incorporated by reference herein in its entirety.

BACKGROUND

1. Field

One or more embodiments described herein relate to a display apparatus.

2. Description of the Related Art

A variety of display devices have been developed. One type of display device is bendable in order to improve visibility at various angles and/or to reduce a non-display area. However, defects may occur in such a device. Also, current methods for making bendable displays reduce lifespan and increase manufacturing costs.

SUMMARY

In accordance with one or more embodiments, a display apparatus includes a substrate including a bending area between a first area and a second area and bent about a bending axis; a display over an upper surface of the substrate in the first area; and a protective film over a lower surface of the substrate, the protective film including a first protective film base over the lower surface of the substrate and corresponding to at least a part of the first area and a first adhesive layer between the substrate and the first protective film base, wherein the first protective film base includes a first thick portion having a first thickness and a first thin portion having a second thickness less than the first thickness and closer to the bending area than the first thick portion.

The first thick portion may be spaced from the first thin portion. The first thick portion and the first thin portion may be integral with each other. In the first adhesive layer, a thickness of a portion corresponding to the first thin portion is greater than a thickness of a portion corresponding to the first thick portion. The first protective film base may include a first tapered portion that includes the first thick portion and the first thin portion, the first tapered portion having a thickness decreasing toward the bending area at an edge of the first protective film base in a direction toward the bending area.

A distance from an upper surface of the first protective film base in a direction toward the substrate to the lower surface of the substrate may increase, from the first tapered portion toward the bending area. A distance from a lower surface of the first protective film base to the lower surface of the substrate may be constant, from the first tapered portion to the bending area. A distance from a lower surface of the first adhesive layer toward the first protective film base to the lower surface of the substrate may increase, from a portion of the first adhesive layer, which corresponds to the first tapered portion, to the bending area. The first tapered portion may be in the first area.

The protective film may include a second protective film base spaced from the first protective film base and over the lower surface of the substrate for at least part of the second area, and a second adhesive layer between the substrate and second protective film base. The second protective film base may have a constant thickness.

The second protective film base may include a second thick portion having a third thickness, and a second thin portion having a fourth thickness less than the third thickness and closer to the bending area than the second thick portion. The second thick portion may be spaced from the second thin portion. The second thick portion and the second thin portion may be integral with each other. In the second adhesive layer, a thickness of a portion corresponding to the second thin portion may be greater than a thickness of a portion corresponding to the second thick portion.

The second protective film base may include a second tapered portion that includes the second thick portion and the second thin portion, the second tapered portion having a thickness decreasing toward the bending area at an edge of the second protective film base in a direction toward the bending area. A distance from an upper surface of the second protective film base in a direction toward the substrate to the lower surface of the substrate may increase, from the second tapered portion toward the bending area.

A distance from a lower surface of the second protective film base to the lower surface of the substrate may be constant, from the second tapered portion to the bending area. A distance from a lower surface of the second adhesive layer in a direction toward the second protective film base to the lower surface of the substrate may increase, from a portion of the second adhesive layer, which corresponds to the second tapered portion, to the bending area. The second tapered portion may be in the second area.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
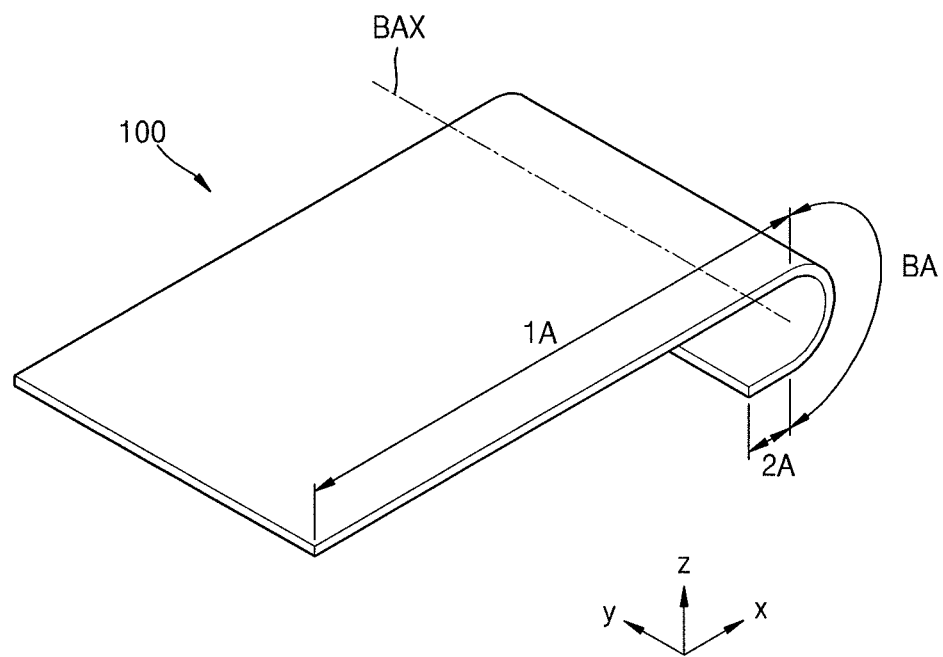
FIG. 1 illustrates an embodiment of a display apparatus.

Example embodiments are described more fully hereinafter with reference to the drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments (or portions thereof) may be combined to form additional embodiments.

In the drawings, the dimensions of layers and regions may be exaggerated for clarity of illustration. It will also be understood that when a layer or element is referred to as being "on" another layer or element, it can be directly on the other layer or element, or intervening layers or elements may also be present. Further, it will be understood that when a layer is referred to as being "under" another layer, it can be directly under the other layer, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

Figure 2:
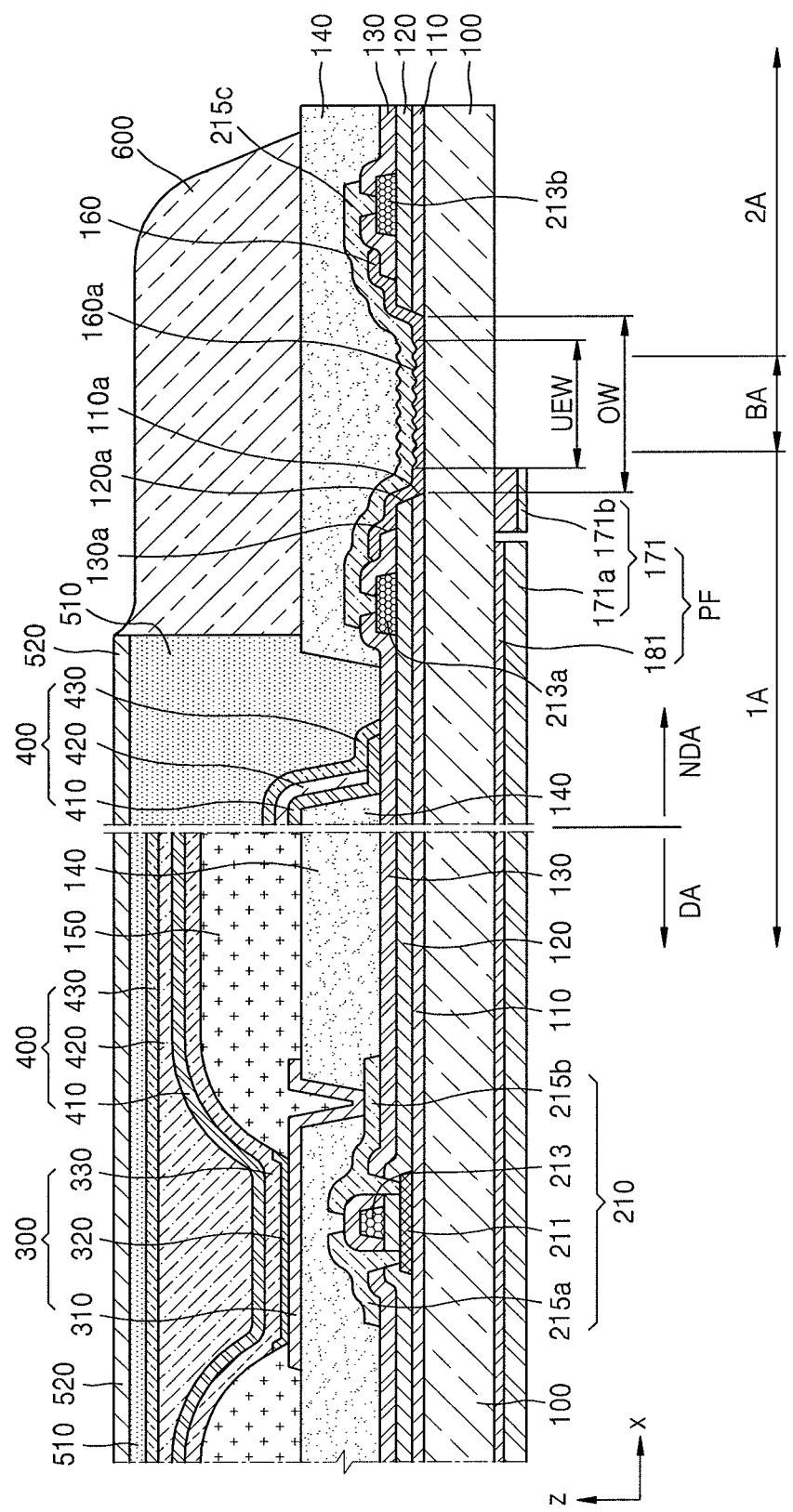
FIG. 2 illustrates a cross-sectional embodiment of the display apparatus.

FIG. 1 illustrates an embodiment of a display apparatus, and FIG. 2 illustrates a cross-sectional embodiment of the display apparatus of FIG. 1. The display apparatus includes a substrate 100 that is at least partially bent, and thus the display apparatus also has a at least partially bent shape like the substrate 100. FIG. 2 shows the display apparatus that is not in a bent or curved state for convenience of description.

Referring to FIG. 1, the substrate 100 includes a bending area BA extending in a first direction (+y direction). The bending area BA is located between a first area 1A and a second area 2A in a second direction (+x direction) crossing the first direction. The substrate 100 bends about a bending axis BAX that extends in the first direction (+y direction) in FIG. 1. The substrate 100 may include various materials having flexible or bendable characteristics. Examples of these materials include but are not limited to polymer resins, e.g., polyethersulphone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), or cellulose acetate propionate (CAP).

The first area 1A includes a display area DA. The first area 1A may further include a part of a non-display area NDA adjacent to the display area DA, as illustrated in FIG. 2. The second area 2A also includes the non-display area NDA.

A display apparatus includes a display device 300 and a thin film transistor 210 in the display area DA of an upper surface of the substrate 100 (in a +z direction). The display device 300 may be electrically connected to the thin film transistor 210. In FIG. 2, an organic light-emitting device is located in the display area DA and corresponds to the display device 300. Electrical connection of the organic light-emitting device to the thin film transistor 210 may involve connecting a pixel electrode 310 to the thin film transistor 210.

Another thin film transistor may also be located on a peripheral area outside the display area DA of the substrate 100. The thin film transistor on the peripheral area may be, for example, part of a circuit for controlling electric signals to be applied to the display area DA. In another embodiment, the display device 300 may be located at least partially in the bending area BA or at least partially in the second area 2A, if necessary.

The thin film transistor 210 may include a semiconductor layer 211, a gate electrode 213, a source electrode 215a, and a drain electrode 215b. The semiconductor layer 211 may include amorphous silicon, polycrystalline silicon, or an organic semiconductor material. A gate insulating layer 120 may be between the semiconductor layer 211 and gate electrode 213. The gate insulating layer 120 may include an inorganic material such as silicon oxide, silicon nitride, and/or silicon oxynitride.

An interlayer insulating layer 130 may be on the gate electrode 213. The source electrode 215a and the drain electrode 215b may be on the interlayer insulating layer 130. The interlayer insulating layer 130 may include, for example, an inorganic material such as silicon oxide, silicon nitride, and/or silicon oxynitride. The insulating layers including the inorganic material may be formed, for example, by chemical vapor deposition (CVD) or atomic layer deposition (ALD).

A buffer layer 110 may be between the thin film transistor 210 (having the above structure) and the substrate 100. The buffer layer 110 may include an inorganic material such as silicon oxide, silicon nitride, and/or silicon oxynitride. The buffer layer 110 may improve smoothness of the upper surface of the substrate 100 or may prevent or reduce infiltration of impurities from the substrate 100 into the semiconductor layer 211 of the thin film transistor 210.

A planarization layer 140 may be on the thin film transistor 210. For example, as illustrated in FIG. 2, when the organic light-emitting device is on the thin film transistor 210, the planarization layer 140 may planarize an upper portion of the thin film transistor 210. The planarization layer 140 may include, for example, an organic material such as acryl, benzocyclobutene (BCB), and hexamethyldisiloxane (HMDSO). The planarization layer 140 has a single-layered structure in FIG. 2. In another embodiment, the planarization layer 140 may have a multi-layered structure. In addition, the planarization layer 140 may have an opening outside the display area DA, so that a part of the planarization layer 140 in the display area DA and a part of the planarization layer 140 in the second area 2A are physically separate from each other. Thus, external impurities may not reach the display area DA via the planarization layer 140.

In the display area DA, the organic light-emitting device may be on the planarization layer 140. The organic light-emitting device includes an intermediate layer 320 between the pixel electrode 310 and an opposite electrode 330. The intermediate layer 320 may include an emission layer. The pixel electrode 310 may contact one of the source electrode 215a and the drain electrode 215b via an opening in the planarization layer 140 and may be electrically connected to the thin film transistor 210, as in FIG. 2.

A pixel defining layer 150 may be on the planarization layer 140. The pixel defining layer 150 includes openings corresponding respectively to sub-pixels (e.g., at least an opening exposing a center portion of the pixel electrode 310) to define pixels. Also, in FIG. 2, the pixel defining layer 150 increases the distance between an edge of the pixel electrode 310 and the opposite electrode 330 above the pixel electrode 310, in order to prevent an electric arc from generating at the edge of the pixel electrode 310. The pixel defining layer 150 may include an organic material, for example, PI or HMDSO.

The intermediate layer 320 of the display device 300 may include low-molecular weight organic materials or polymer materials. When the intermediate layer includes a low-molecular weight organic material, the intermediate layer 320 may include a hole injection layer (HIL), a hole transport layer (HTL), an emission layer (EML), an electron transport layer (ETL), and/or an electron injection layer (EIL) in a single or multiple-layered structure. Examples of organic materials include copper phthalocyanine (CuPc), N,N-Di(naphthalene-1-yl)-N,N'-diphenyl-benzidine (NPB), and tris-8-hydroxyquinoline aluminum ($Alq_3$). The low-molecular weight organic materials may be deposited, for example, by a vacuum deposition method.

When the intermediate layer 320 includes a polymer material, the intermediate layer 320 may include an HTL and an EML. The HTL may include PEDOT and the EML may include a poly-phenylenevinylene (PPV)-based or polyfluorene-based polymer material, for example. The intermediate layer 320 as described above may be formed, for example, by a screen printing method, an inkjet printing method, or a laser induced thermal imaging (LITI) method.

The intermediate layer 320 may have a different structure in another embodiment. In addition, the intermediate layer 320 may include a layer that is integrally formed throughout a plurality of pixel electrodes 310 or a layer that is patterned to correspond to each of the pixel electrodes 310.

The opposite electrode 330 is in or above the display area DA and may cover the display area DA, as in FIG. 2. For example, the opposite electrode 330 may be integrally formed with respect to a plurality of organic light-emitting devices, so as to correspond to a plurality of pixel electrodes 310.

Since the organic light-emitting device may be easily damaged by external moisture or oxygen, an encapsulation layer 400 may cover the organic light-emitting device to protect the organic light-emitting device. The encapsulation layer 400 covers the display area DA and may extend outside of the display area DA. The encapsulation layer 400 may include a first inorganic encapsulation layer 410, an organic encapsulation layer 420, and a second inorganic encapsulation layer 430, as illustrated in FIG. 2.

The first inorganic encapsulation layer 410 covers the opposite electrode 330, and may include silicon oxide, silicon nitride, and/or silicon oxynitride. If necessary, other layers such as a capping layer may be between the first inorganic encapsulation layer 410 and the opposite electrode 330. Since the first inorganic encapsulation layer 410 is formed according to a structure thereunder, the first inorganic encapsulation layer 410 may have an uneven upper surface. The organic encapsulation layer 420 covers the first inorganic encapsulation layer 410.

Unlike the first inorganic encapsulation layer 410, the organic encapsulation layer 420 may have an even upper surface. For example, the organic encapsulation layer 420 may have a substantially even upper surface at a portion corresponding to the display area DA.

The organic encapsulation layer 420 may include at least one of PET, PEN, PC, PI, polyethylene sulfonate, polyoxymethylene, polyarylate, and hexamethyldisiloxane. The second inorganic encapsulation layer 430 covers the organic encapsulation layer 420 and may include silicon oxide, silicon nitride, and/or silicon oxynitride.

The second inorganic encapsulation layer 430 may contact the first inorganic encapsulation layer 410 at an edge thereof outside the display area DA, in order not to expose the organic encapsulation layer 420 to the outside.

According to the present embodiment, if a crack occurs in the encapsulation layer 400, the crack may not cause a disconnection to form (e.g. or may not propagate) between the first inorganic encapsulation layer 410 and the organic encapsulation layer 420 or between the organic encapsulation layer 420 and the second inorganic encapsulation layer 430. This is because of the multi-layered structure of the encapsulation layer 400 formed from the first inorganic encapsulation layer 410, the organic encapsulation layer 420, and the second inorganic encapsulation layer 430. Thus, the formation of a path through which external moisture or oxygen may infiltrate into the display area DA may be reduced or prevented.

A polarization plate 520 may be attached on the encapsulation layer 400 via an optically clear adhesive (OCA) 510. The polarization plate 520 may reduce reflection of external light. For example, when external light that passed through the polarization plate 520 is reflected by an upper surface of the opposite electrode 330 and then passes through the polarization plate 520 again, the external light passes through the polarization plate 520 twice and a phase of the external light may be changed. Therefore, the phase of reflected light is different from the phase of the external light entering the polarization plate 520, and thus destructive interference occurs. As a result, reflection of the external light may be reduced and visibility may be improved. The OCA 510 and the polarization plate 520 may cover an opening in the planarization layer 140, as in FIG. 2.

The display apparatus may not include the polarization plate 520 in some embodiments. For example, the polarization plate 520 may be omitted or replaced by other elements. In one embodiment, the polarization plate 520 may be omitted and a black matrix and a color filter may be used to reduce reflection of external light.

In addition, the buffer layer 110, the gate insulating layer 120, and the interlayer insulating layer 130 may include inorganic material and thus may collectively be referred to as an inorganic insulating layer. The inorganic insulating layer may include an opening corresponding to the bending area BA, as in FIG. 2. For example, the buffer layer 110, the gate insulating layer 120, and the interlayer insulating layer 130 may respectively include openings 110a, 120a, and 130a corresponding to the bending area BA. The opening(s) may correspond to the bending area BA in the sense that the opening(s) overlap the bending area BA.

An area of the opening may be greater than that of the bending area BA. To accomplish this, in FIG. 2, the width OW of the opening is greater than that of the bending area BA. The area of the opening may be defined, for example, as the smallest area among areas of the openings 110a, 120a, and 130a of the buffer layer 110, the gate insulating layer 120, and the interlayer insulating layer 130. In FIG. 2, the area of the opening is defined by an area of the opening 110a in the buffer layer 110.

An inner side surface of the opening 110a of the buffer layer 110 and an inner side surface of the opening 120a in the gate insulating layer 120 correspond to each other in FIG. 2. In another embodiment, the area of the opening 120a of the gate insulating layer 120 may be greater than that of the opening 110a in the buffer layer 110. In one embodiment, an inner side surface of the opening 120a in the gate insulating layer 120 and an inner side surface of the opening 130a in the interlayer insulating layer 130 may correspond to each other. In either case, the area of the opening may be also defined, for example, as the smallest area among areas of the openings 110a, 120a, and 130a of the buffer layer 110, the gate insulating layer 120, and the interlayer insulating layer 130.

In the present embodiment, the display apparatus includes an organic material layer 160 that at least partially fills the opening in the inorganic insulating layer. In FIG. 2, the organic material layer 160 completely fills the opening. In addition, according to the present embodiment, the display apparatus includes a first conductive layer 215c that extends from the first area 1A to the second area 2A through the bending area BA and is above the organic material layer 160. The first conductive layer 215c may be on the inorganic insulating layer such as the interlayer insulating layer 130, for example, if the organic material layer 160 is omitted. In one embodiment, the first conductive layer 215c may be formed simultaneously with the source electrode 215a or the drain electrode 215b using the same material as that of source electrode 215a or drain electrode 215b.

FIG. 2 shows the display apparatus that is not in a bent state in the cross-sectional view for convenience of description. However, the substrate 100 is bent in the bending area BA in FIG. 1. To accomplish this, the display apparatus is manufactured so that the substrate 100 is flat (for example, as in FIG. 2) during the manufacturing processes. Subsequently, the substrate 100 is bent at the bending area BA so that the display apparatus may have the shape as shown in FIG. 1. While the substrate 100 is bent at the bending area BA, tensile stress may be applied to the first conductive layer 215c. However, in the display apparatus according to the present embodiment, the occurrence of defects in the first conductive layer 215c during the bending process may be reduced or prevented.

If the inorganic insulating layer including the buffer layer 110, the gate insulating layer 120, and/or the interlayer insulating layer 130 does not include the opening corresponding to the bending area BA, but continuously extends from the first area 1A to the second area 2A, and if the first conductive layer 215c is on such above inorganic insulating layer, large tensile stress is applied to the first conductive layer 215c during bending the substrate 100. For example, since the inorganic insulating layer has a greater hardness than that of the organic material layer, cracks may form in the inorganic insulating layer in the bending area BA. When a crack forms in the inorganic insulating layer, the crack may also occur in the first conductive layer 215c on the inorganic insulating layer. Thus, the probability of generating defects (e.g., disconnection in the first conductive layer 215c) increases greatly.

However, according to the present embodiment, the inorganic insulating layer includes an opening corresponding to the bending area BA, and part of the first conductive layer 215c, which corresponds to the bending area BA, is on the organic material layer 160 that at least partially fills the opening of the inorganic insulating layer. Since the inorganic insulating layer includes the opening corresponding to the bending area BA, the possibility of cracks occurring in the inorganic insulating layer is significantly low. Also, the organic material layer 160 is less likely to have cracks due to characteristics of the organic material. Therefore, the occurrence of cracks in the portion of the first conductive layer 215c on the organic material layer 160 may be reduced or prevented, where the portion of the first conductive layer 215c corresponds to the bending area BA. Also, since the organic material layer 160 has a lower hardness than that of an inorganic material layer, the organic material layer 160 may absorb tensile stress generated due to the bending of the substrate 100, to thereby reduce concentration of the tensile stress on the first conductive layer 215c.

The display apparatus according to the present embodiment may include second conductive layers 213a and 213b in addition to the first conductive layer 215c. The second conductive layers 213a and 213b are formed in the first area 1A or the second area 2A at a different layer level from the first conductive layer 215c, and also may be electrically connected to the first conductive layer 215c. In FIG. 2, the second conductive layers 213a and 213b may include the same material as the gate electrode 213 of the thin film transistor 210, and are at the same layer as the gate electrode 213, e.g., on the gate insulating layer 120. In addition, the first conductive layer 215c contacts the second conductive layers 213a and 213b via contact holes in the interlayer insulating layer 130. In addition, the second conductive layer 213a is in the first area 1A, and the second conductive layer 213b is in the second area 2A.

The second conductive layer 213a in the first area 1A may be electrically connected to the thin film transistor 210 in the display area DA. Accordingly, the first conductive layer 215c may be electrically connected to the thin film transistor 210 of the display area DA via the second conductive layer 213a. The second conductive layer 213b in the second area 2A may also be electrically connected to the thin film transistor of the display area DA via the first conductive layer 215c. As such, the second conductive layers 213a and 213b outside of the display area DA may be electrically connected to the elements in the display area DA, or may extend toward the display area DA so that at least some portions of the second conductive layers 213a and 213b are in the display area DA.

The state in which the display apparatus is not bent is illustrated in FIG. 2, but the display apparatus of the present embodiment is actually in a state in which the substrate 100 is bent in the bending area BA in FIG. 1. To accomplish this, the display apparatus is manufactured so that the substrate 100 is flat, as in FIG. 2, during the manufacturing processes. Subsequently, the substrate 100 is bent in the bending area BA so that the display apparatus may have the shape in FIG. 1. While the substrate 100 is bent in bending area BA, tensile stress may be applied to elements in bending area BA.

Therefore, the first conductive layer 215c crossing over the bending area BA includes a material having high elongation rate, so that defects such as cracks in the first conductive layer 215c or disconnection of the first conductive layer 215c may be prevented. In addition, the second conductive layers 213a and 213b, including a material having an elongation rate lower than that of the first conductive layer 215c and electrical/physical characteristics different from those of the first conductive layer 215c, are formed in the first area 1A or the second area 2A. Thus, the efficiency of transferring electric signals in the display apparatus may be improved or a defect rate during the manufacturing processes of the display apparatus may be reduced. The second conductive layers 213a and 213b may include, for example, molybdenum and the first conductive layer 215c may include, for example, aluminum. The first conductive layer 215c and the second conductive layers 213a and 213b may have multi-layered structures.

Unlike FIG. 2, at least part of an upper portion of the second conductive layer 213b in the second area 2A may not be covered by the planarization layer 140, but is exposed to the outside in order to electrically connect to various electronic devices or printed circuit boards.

In addition, in FIG. 2, the organic material layer 160 may cover the inner side surface of the opening in the inorganic insulating layer. As described above, since the first conductive layer 215c may include the same material and may be formed simultaneously with the source electrode 215a and the drain electrode 215b, a conductive layer may be formed on an entire surface of the substrate 100 and may be patterned to form the source electrode 215a, the drain electrode 215b, and the first conductive layer 215c. If the organic material layer 160 does not cover the inner side surface of the opening 110a in the buffer layer 110, of the opening 120a in the gate insulating layer 120, or of the opening 130a in the interlayer insulating layer 130, the conductive material of the conductive layer may not be removed from, but may remain on, the inner side surface of the opening 110a in the buffer layer 110, the inner side surface of the opening 120a in the gate insulating layer 120, or the inner side surface of the opening 130a in the interlayer insulating layer 130. In this case, the remaining conductive material may cause electrical shorts to form between different conductive layers.

Therefore, when the organic material layer 160 is formed, the organic material layer 160 may cover the inner side surface of the opening in the inorganic insulating layer. Although the organic material layer 160 has been described to have a constant thickness, the organic material layer 160 may have a thickness that varies, for example, depending on location. For example, the organic material layer 160 may have an upper surface with a gentle inclination around the inner side surface of the opening 110a of the buffer layer 110, the inner side surface of the opening 120a of the gate insulating layer 120, or the inner side surface of the opening 130a in the interlayer insulating layer 130. Accordingly, when the conductive layer is patterned to form the source electrode 215a, the drain electrode 215b, and the first conductive layer 215c, the conductive material that should have been removed may be completely removed.

The organic material layer 160 may have an uneven surface 160a in at least part of an upper surface thereof in a +z direction, as in FIG. 2. Since the organic material layer 160 includes the uneven surface 160a, the first conductive layer 215c on the organic material layer 160 may have an upper surface and/or a lower surface having a shape corresponding to the uneven surface 160a of the organic material layer 160.

As described above, since the tensile stress may be applied to the first conductive layer 215c when the substrate 100 is bent at the bending area BA in a manufacturing process, the amount of tensile stress applied to the first conductive layer 215c may be reduced when the upper surface and/or the lower surface of the first conductive layer 215c has a shape corresponding to the uneven surface 160a of the organic material layer 160. Thus, the tensile stress generated during the bending process may be reduced via deformation of the shape of the organic material layer 160 having relatively less hardness. The first conductive layer 215c having the uneven shape at least before the bending process may be transformed to correspond to the shape of the organic material layer 160, which is deformed due to the bending process. Thus, the occurrence of defects (e.g., disconnection in the first conductive layer 215c) may be prevented.

Also, since the uneven surface 160a is formed at least partially in the upper surface of the organic material layer 160 (in the +z direction), the surface area of the upper surface of the organic material layer 160 and the surface area of the upper and lower surfaces of the first conductive layer 215c in the opening may be increased. A large surface area of the upper surface of the organic material layer 160 and the upper and lower surfaces of the first conductive layer 215c may allow a deformation margin to be large in order to reduce tensile stress caused by bending of the substrate 100.

Since the first conductive layer 215c is on the organic material layer 160, the lower surface of the first conductive layer 215c has a shape corresponding to the uneven surface 160a of the organic material layer 160. However, the upper surface of the first conductive layer 215c may have an uneven surface with a shape independent from the shape of the uneven surface 160a of the organic material layer 160.

For example, after forming a conductive material layer on the organic material layer 160, a photoresist may be applied to the conductive material layer. The photoresist may be developed while varying the exposure amount, according to locations on the photoresist, using a slit mask or a half-tone mask. Accordingly, the conductive material layer exposed due to developing of the photoresist is etched. Then, the photoresist is removed. Thus, the first conductive layer 215c is formed.

Since the exposure amount varies depending on the locations on the photoresist using the slit mask or the half-tone mask, the degree of etching the conductive material layer may vary depending on the location on the conductive material layer. Therefore, an uneven surface may be artificially formed in the upper surface of the first conductive layer 215c. In this case, the upper surface of the first conductive layer 215c may have an uneven surface with an independent shape from that of the uneven surface 160a of the organic material layer 160.

Even if the process of artificially forming the uneven surface in the upper surface of the first conductive layer 215c is performed as described above, the uneven surface on the upper surface of the first conductive layer 215c may correspond to the uneven surface 160a of the organic material layer 160.

The uneven surface 160a on the upper surface (in the +z direction) of the organic material layer 160 may be formed in various ways. For example, a photoresist material may be used when the organic material layer 160 is formed. The exposure amount may vary depending on locations on the organic material layer 160, the upper surface of which is flat, using a slit mask or a half-tone mask. Thus, a certain portion may be etched (removed) more than other portions. The portion that is etched more than other portions may be a depressed portion in the upper surface of the organic material layer 160. In another embodiment, after forming the organic material layer 160 with a flat upper surface, the certain portions may be removed by dry etching or other methods.

In order for the organic material layer 160 to have the uneven surface 160a in its upper surface (in the +z direction), the organic material layer 160 may include a plurality of grooves in its upper surface (in the +z direction) thereof. The grooves may extend in a first direction (+y direction). The shape of the upper surface of the first conductive layer 215c on the organic material layer 160 may correspond to the shape of the upper surface of the organic material layer 160.

The uneven surface 160a of the organic material layer 160 may only be within the opening of the inorganic insulating layer. In FIG. 2, the width UEW of the uneven surface 160a of the organic material layer 160 is less than a width OW of the opening of the inorganic insulating layer. If the organic material layer 160 has the uneven surface 160a throughout the inside and outside of the opening in the inorganic insulating layer, the uneven surface 160a of the organic material layer 160 is near the internal surface of the opening 110a in the buffer layer 110, the internal surface of the opening 120a in the gate insulating layer 120, or the internal surface of the opening 130a in the interlayer insulating layer 130. In this case, the organic material layer 160 has a relatively smaller thickness on depressed portions than that on protruding portions.

Thus, when the depressed portions are located around the internal surface of the opening 110a in the buffer layer 110, the internal surface of the opening 120a in the gate insulating layer 120, or the internal surface of the opening 130a in the interlayer insulating layer 130, the organic material layer 160 may be disconnected. Therefore, the uneven surface 160a of the organic material layer 160 may only be within the opening of the inorganic insulating layer. Thus, the disconnection of the organic material layer 160 around the internal surface of the opening 110a in the buffer layer 110, the internal surface of the opening 120a of the gate insulating layer 120, or the internal surface of the opening 130a in the interlayer insulating layer 130 may be prevented.

As described above, in order to prevent a disconnection of the first conductive layer 215c in the bending area BA, the organic material layer 160 may have the uneven surface 160a over the bending area BA. Therefore, the area of the uneven surface 160a of the organic material layer 160 may be greater than that of the bending area BA and less than that of the opening. For example, as illustrated in FIG. 2, the width UEW of the uneven surface 160a of the organic material layer 160 is greater than the width of the bending area BA and less than the width OW of the opening.

A bending protection layer (BPL) 600 may be located outside the display area DA. For example, the BPL 600 may be located over the first conductive layer 215c and may correspond at least to the bending area BA.

When a stack structure is bent, there is a stress neutral plane in the stack structure. If there is no BPL 600, when the substrate 100 is bent, excessive tensile stress may be applied to the first conductive layer 215c in the bending area BA, because the location of the first conductive layer 215c may not correspond to a stress neutral plane. However, by forming the BPL 600 and adjusting a thickness and a modulus of the BPL 600, the location of the stress neutral plane in the structure including the substrate 100, the first conductive layer 215c, and the BPL 600 may be adjusted. Therefore, the stress neutral plane may be adjusted to be around the first conductive layer 215c via the BPL 600. Thus, the tensile stress applied to the first conductive layer 215c may be reduced.

The BPL 600 may extend to an end of the substrate 100 in the display apparatus, unlike the example of FIG. 2. For example, in the second area 2A, the first conductive layer 215c, the second conductive layer 213b, and/or other conductive layers electrically connected to the first and second conductive layers 215c and 213b may not be covered at least partially by the interlayer insulating layer 130 or the planarization layer 140, but may be electrically connected to various electronic devices or printed circuit boards. Accordingly, the first conductive layer 215c, the second conductive layer 213b, and/or the other conductive layers electrically connected to the first and second conductive layers 215c and 213b may have portions that are electrically connected to the various electronic devices or the printed circuit boards. The electrically connected portions may be protected against external impurities such as external moisture. Thus, the BPL 600 may cover the electrically connected portions in order to perform as a protective layer as well. To accomplish this, the BPL 600 may extend, for example, to the end of the substrate 100 of the display apparatus.

The upper surface of the BPL 600 in a direction toward the display area DA (−x direction) coincides with the upper surface of the polarization plate 520 in the +z direction in FIG. 2. In one or more other embodiments, the end of the BPL 600 in the display area DA direction (−x direction) may partially cover the upper surface at the end of the polarization plate 520. Otherwise, the end of the BPL 600 in the display area DA direction (−x direction) may not contact the polarization plate 520 and/or the OCA 510. In the latter case, during or after forming BPL 600, the movement of gas generated from the BPL 600 in a direction toward the display area DA (−x direction) and degradation of the display device 300 (e.g., the organic light-emitting device) may be prevented.

As shown in FIG. 2, if the upper surface of the BPL 600 in a direction toward the display area DA (−x direction) coincides with the upper surface of the polarization plate 520 in the +z direction, if the end of the BPL 600 in the display area DA direction (−x direction) partially covers the upper surface at the end of the polarization plate 520, or if the end of the BPL 600 in the display area DA direction (−x direction) contacts the OCA 510, the thickness of the BPL 600 corresponding to the display area DA (−x direction) may be greater than that of the other portions in the BPL 600.

Since a liquid phase material or a paste-type material may be applied and hardened to form the BPL 600, the volume of the BPL 600 may be reduced through the hardening process. If the portion of the BPL 600 corresponding to the display area DA (−x direction) is in contact with the polarization plate 520 and/or the OCA 510, the portion of the BPL 600 is fixed at the location. Thus, a volume reduction occurs in remaining portion of the BPL 600. Therefore, the thickness of the BPL 600 corresponding to the display area DA (−x direction) may be greater than the other portion in the BPL 600.

In addition, in FIG. 2, a protective film PF is on a lower surface of the substrate 100. The protective film PF is a lower protective film for protecting the lower surface of the substrate 100, may include a first protective film base 171 and a first adhesive layer 181 (e.g., a pressure sensitive adhesive (PSA)) between the first protective film base 171 and the substrate 100 for attaching the first protective film base 171 to the substrate 100. The first protective film base 171 may include PET or PI, and may correspond to at least a part of the first area 1A.

The first protective film base 171 includes a first thick portion 171a having a first thickness and a first thin portion 171b closer to the bending area BA than the first thick portion 171a with a second thickness less than the first thickness. In addition, the first protective film base 171 is in the first area 1A. The first adhesive layer 181 is between the first protective film base 171 and the substrate 100. Thus, the first adhesive layer 181 may have a greater thickness at a portion corresponding to the first thin portion 171b than that at a portion corresponding to the first thick portion 171a.

To accomplish this, the portion of the first adhesive layer 181, which corresponds to the first thin portion 171b, may have a multi-layered structure. This will be applied to other embodiments and modified examples thereof that will be described later. In FIG. 2, an end of the protective film PF in a direction toward the bending area BA corresponds to the end of the uneven surface 160a in the organic material layer 160 toward the first area 1A. This may be different in other embodiments.

Figure 3:
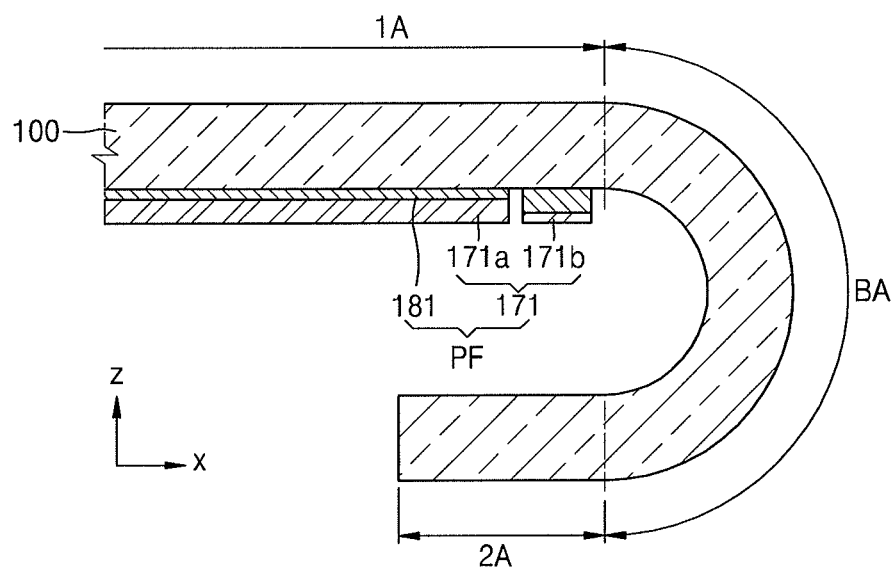
FIG. 3 illustrates another cross-sectional view of the display apparatus.

As described above, FIG. 2 shows the display apparatus that is not in a bent state for convenience of description. However, the display apparatus is actually in a bent state at the bending area BA in FIG. 1. FIG. 3 is a schematic cross-sectional view of a part of the display apparatus that is bent. A frame or a cushion layer in a space between a lower surface of the substrate 100 and the protective film PF may be further provided.

Since the first protective film base 171 of the protective film PF protects the lower surface of the substrate 100, the first protective film base 171 may have its own strength. Accordingly, if the first protective film base 171 has a low flexibility, the first protective film base 171 and the substrate 100 may be separated from each other when the substrate 100 is bent. Otherwise, the substrate 100 or the first conductive layer 215c above the substrate 100 around the end of the first protective film base 171 in a direction toward the bending area BA may be damaged due to the strength of the first protective film base 171. However, according to the display apparatus of the present embodiment, separation of the substrate 100 from the first protective film base 171 or damage on the substrate 100 may be effectively prevented because the first protective film base 171 is in the first area 1A and not in the bending area BA.

For example, stress may be applied to the bending area BA or the first area 1A adjacent to the bending area BA as a result of bending in the bending area BA. However, in the display apparatus according to the present embodiment, the first thin portion 171b (that is less than the first thick portion 171a in thickness) in the first protective film base 171 is closer to the bending area BA. Since the first thin portion 171b is less than the first thick portion 171a in thickness, the first thin portion 171b has relatively lower strength and more flexibility. Therefore, since the first thin portion 171b is adjacent to the bending area BA, separation of the first protective film base 171 from the substrate 100 or damage on the substrate 100 may be reduced or prevented.

Figure 4:
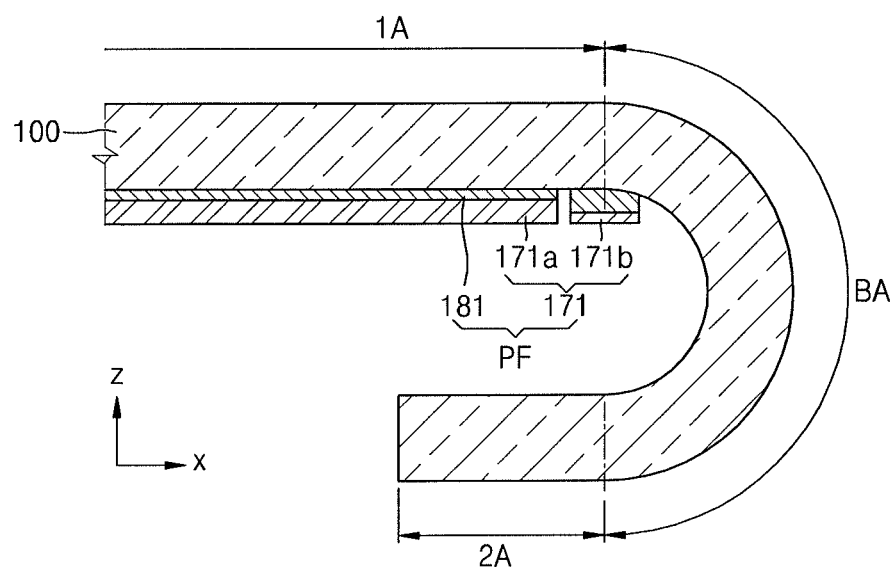
FIG. 4 illustrates another cross-sectional view of the display apparatus.

FIG. 4 is a schematic cross-sectional view illustrating part of the display apparatus. In FIG. 4, the first protective film base 171 may not only be in the first area 1A, but also may be partially in the bending area BA. This may be intentional or may be the result of a miss-alignment between the protective film PF and the substrate 100. However, according to the present embodiment, the first thin portion 171b of the first protective film base 171, which is less than the first thick portion 171a in thickness, is adjacent to the center of the bending area BA. Thus, even if a part of the first protective film base 171 is in the bending area BA, the first thin portion 171b, not the first thick portion 171a, is in the bending area BA.

As described above, since the first thin portion 171b is less than the first thick portion 171a in thickness, the first thin portion 171b has lower strength and is more flexible than the first thick portion 171a. Therefore, even if the first protective film base 171 is partially located in the bending area BA, the first thin portion 171b is in the bending area BA. Accordingly, separation of the first protective film base 171 from the substrate 100 or the damage on the substrate 100 may be effectively reduced or prevented. Moreover, since the first adhesive layer 181 including the PSA is relatively more flexible than the first protective film base 171, stress may be reduced via the first adhesive layer 181.

In FIGS. 2 to 4, the first thick portion 171a and the first thin portion 171b are spaced apart from each other. In other embodiments, for example, as illustrated in FIGS. 5 and 6, the first thick portion 171a and the first thin portion 171b may be in contact and/or integrally formed with each other.

Figure 5:
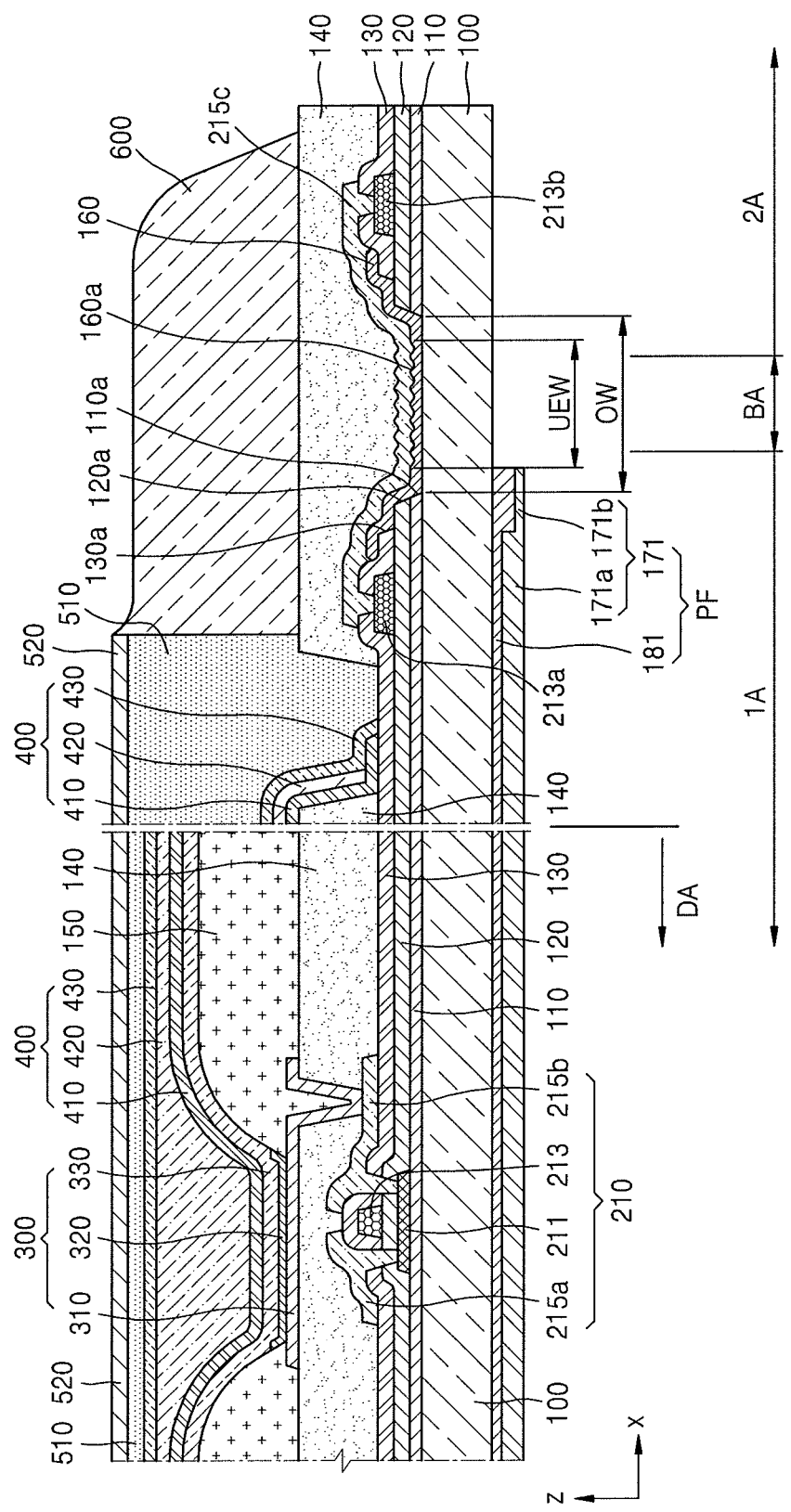
FIG. 5 illustrates another cross-sectional embodiment of a display apparatus.
Figure 6:
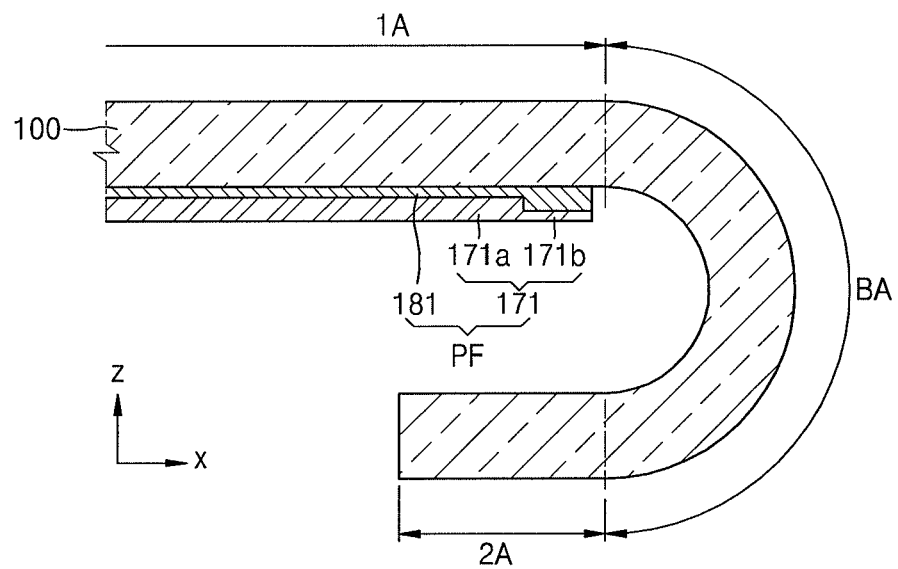
FIG. 6 illustrates another cross-sectional embodiment of a display apparatus.

In FIGS. 5 and 6, the first protective film base 171 is in the first area 1A and not in the bending area BA. Thus, separation of the first protective film base 171 from the substrate 100 or the damage on the substrate 100 may be effectively reduced or prevented. In addition, since the first thin portion 171b, that has the relatively lower strength and is more flexible, is closer to the bending area BA than the first thick portion 171a, separation of the first protective film base 171 from the substrate 100 and damage on the substrate 100 may be effectively reduced or prevented.

Figure 7:
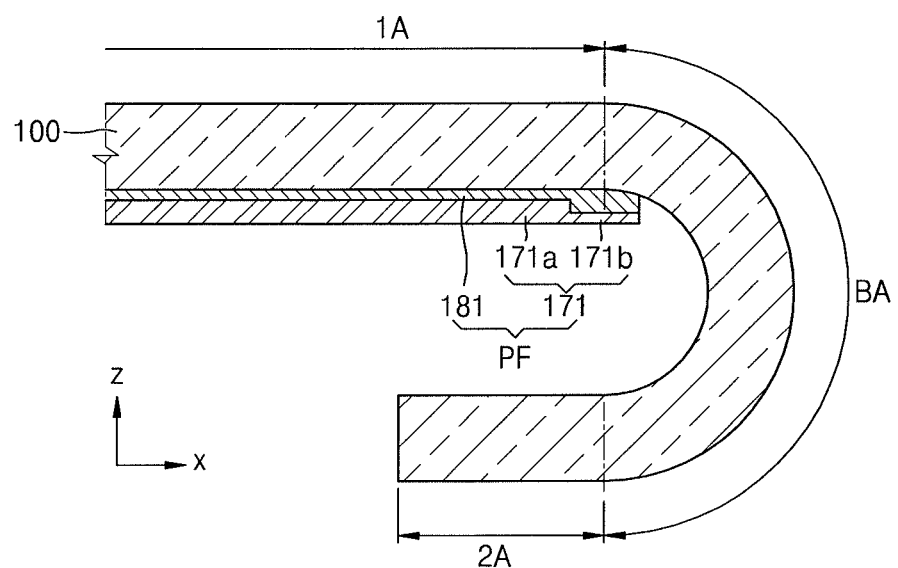
FIG. 7 illustrates another cross-sectional embodiment of a display apparatus.

FIG. 7 illustrates a schematic cross-sectional view of a part of a display apparatus according to another embodiment. In FIG. 7, the first protective film base 171 (which includes the first thick portion 171a and the first thin portion 171b in contact or integrally formed) may not only be in the first area 1A but also may be partially in the bending area BA. This may be intentional or may be a result of a miss-alignment between the protective film PF and the substrate 100.

According to the present embodiment, the first thin portion 171b (that is less than the first thick portion 171a in thickness) is closer to the center of the bending area BA than the first thick portion 171a that has a sufficient thickness in the first protective film base 171. Thus, even if a part of the first protective film base 171 is in the bending area BA, the first thin portion 171b, and not the first thick portion 171a, is in the bending area BA. Thus, since part of the first thin portion 171b that has a relatively lower strength and is more flexible is in the bending area BA, separation of the first protective film base 171 from the substrate 100 or the damage on the substrate 100 may be effectively reduced or prevented. In addition, since the first adhesive layer 181 including the PSA is more flexible than the first protective film base 171, stress may be reduced through the first adhesive layer 181.

Figure 8:
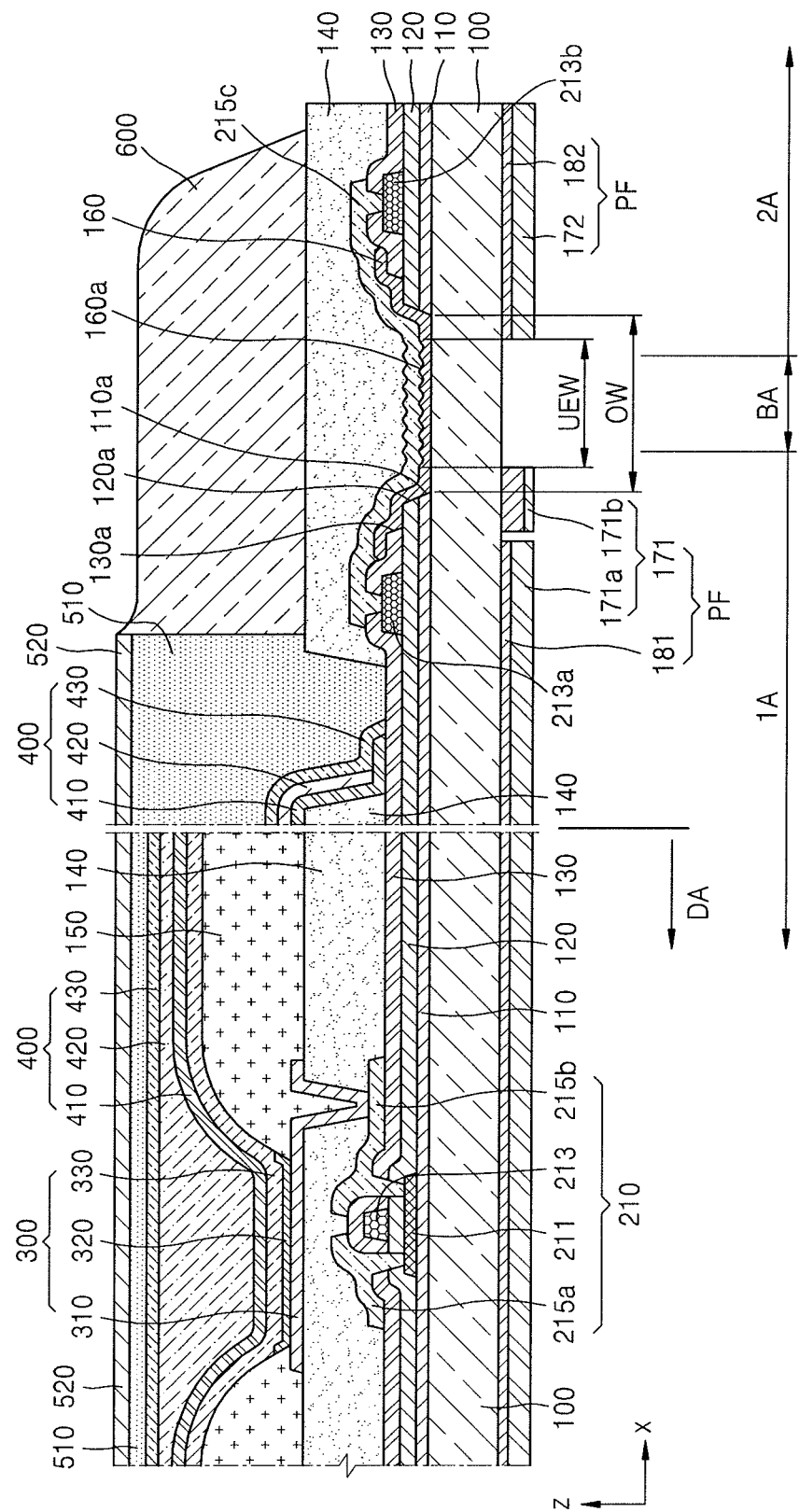
FIG. 8 illustrates another cross-sectional embodiment of a display apparatus.
Figure 9:
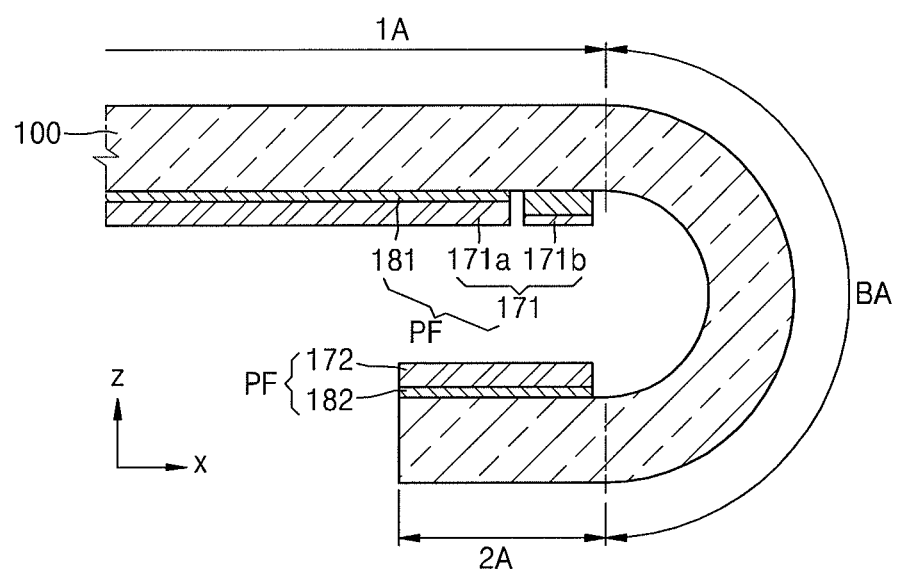
FIG. 9 illustrates another cross-sectional view of the display apparatus in FIG. 8.

FIG. 8 illustrates a cross-sectional view of part of a display apparatus according to another embodiment, and FIG. 9 illustrates another cross-sectional view of the part of the display apparatus of FIG. 8. The display apparatus of this embodiment is different from the display apparatus in FIGS. 2 and 3 in that the protective film PF includes a second protective film base 172 and a second adhesive layer 182, in addition to the first protective film base 171 and the first adhesive layer 181.

The second protective film base 172 is spaced apart from the first protective film base 171, is above the lower surface of the substrate 100, and corresponds to at least part of the second area 2A. The second adhesive layer 182 is between the substrate 100 and the second protective film base 172 in order to fix the second protective film base 172 onto the substrate 100. As described above, since the protective film PF includes the second protective film base 172 and the second adhesive layer 182, the protective film PF may protect more parts on the lower surface of the substrate 100.

In FIG. 8, a spaced distance between the first protective film base 171 and the second protective film base 172 of the protective film PF is equal to the width UEW of the uneven surface 160a of the organic material layer 160. The spaced distance may have a different amount in another embodiment.

Unlike the first protective film base 171, the second protective film base 172 may have a constant thickness as in FIGS. 8 and 9. This is because the second protective film base 172 is in the second area 2A, that is an edge of the substrate 100 where there is no conductive layer subject to damage or there are only a few conductive layers.

Figure 10:
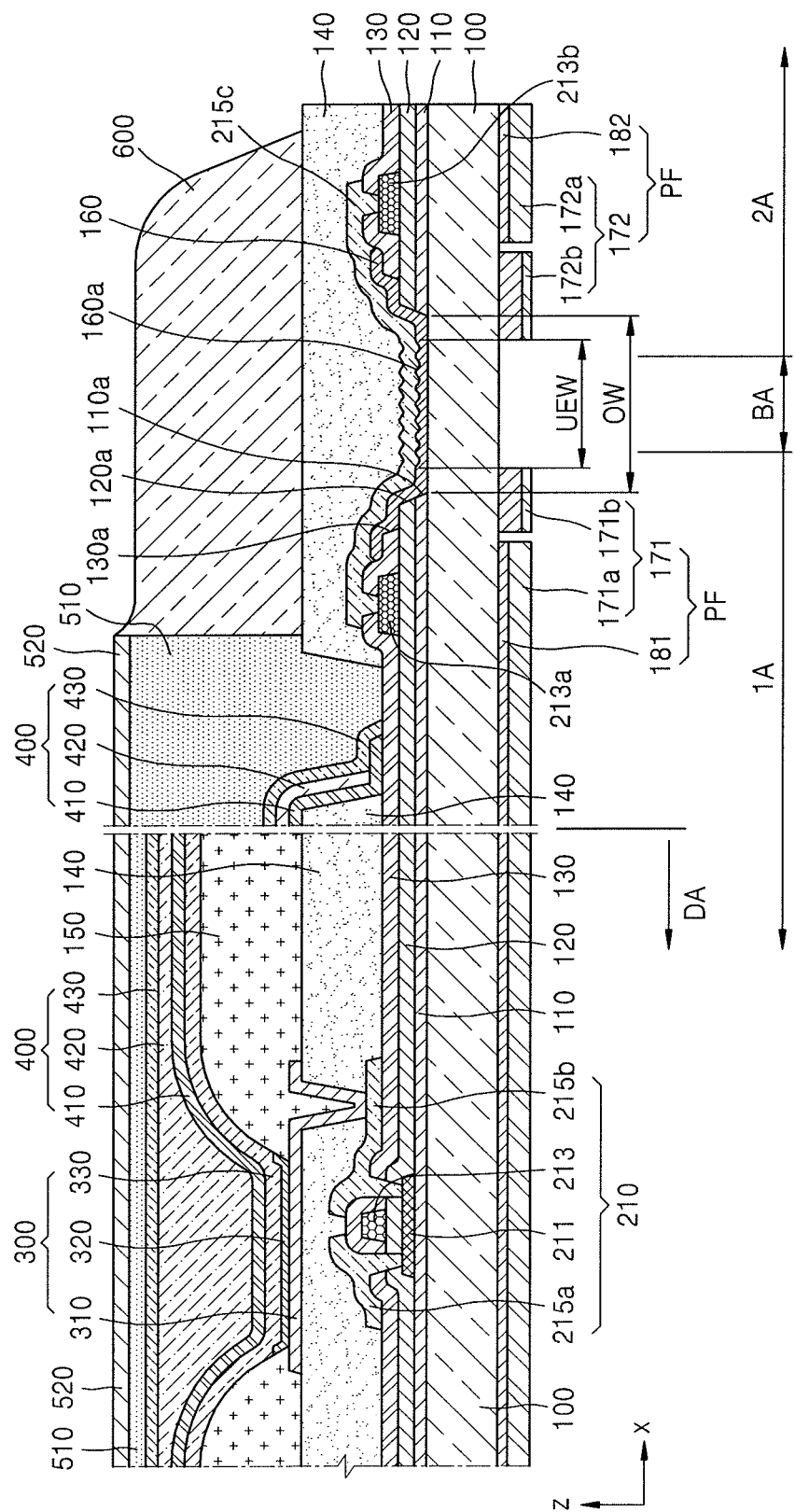
FIG. 10 illustrates another cross-sectional embodiment of a display apparatus.
Figure 11:
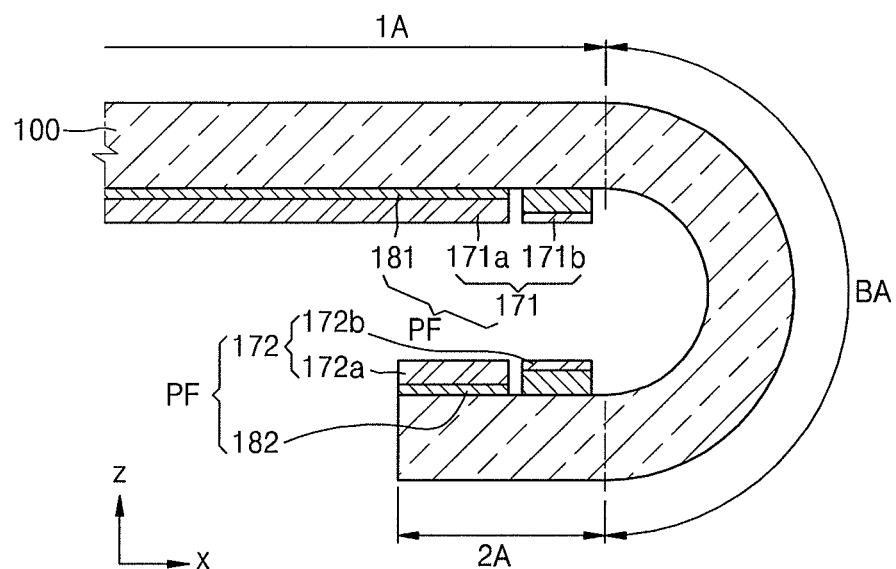
FIG. 11 illustrates another cross-sectional view of the display apparatus in FIG. 10.

This may be difference in other embodiments, for example, as illustrated in the embodiment of FIGS. 10 and 11. In FIGS. 10 and 11, the second protective film base 172 includes a second thick portion 172a having a third thickness and a second thin portion 172b closer to the bending area BA than the second thick portion 172a and having a fourth thickness less than the third thickness, similar to the first protective film base 171. In addition, the second protective film base 172 may be in the second area 2A. The second adhesive layer 182 is between the second protective film base 172 and the substrate 100. Thus, a portion of the second adhesive layer 182 corresponding to the second thin portion 172b may be thicker than a portion corresponding to the second thick portion 172a.

Like the first protective film base 171, the second protective film base 172 of the protective film PF may have its own strength. Accordingly, if the second protective film base 172 has low flexibility, the second protective film base 172 may be separated from the substrate 100 when the substrate 100 is bent. Otherwise, due to the strength of the second protective film base 172, the substrate 100 or the first conductive layer 215c above the substrate 100 may be damaged around the end of the second protective film base 172 in a direction toward the bending area BA. However, in the display apparatus according to the present embodiment, the second protective film base 172 is in the second area 2A and is not located in the bending area BA. Thus, the separation of the second protective film base 172 from the substrate 100 or the damage on the substrate 100 may be effectively reduced or prevented.

Due to bending in the bending area BA, stress may be applied to the bending area BA or a portion of the second area 2A adjacent to the bending area BA. However, i according to the present embodiment, the second thin portion 172b in the second protective film base 172 is closer to the bending area BA than the second thick portion 172a having the sufficient thickness. Since the second thin portion 172b is less than the second thick portion 172a in thickness, the second thin portion 172b has a relatively lower strength and is more flexible. Therefore, since the second thin portion 172b is adjacent to the bending area BA, separation of the second protective film base 172 from substrate 100 or damage on the substrate 100 may be effectively reduced or prevented.

Figure 12:
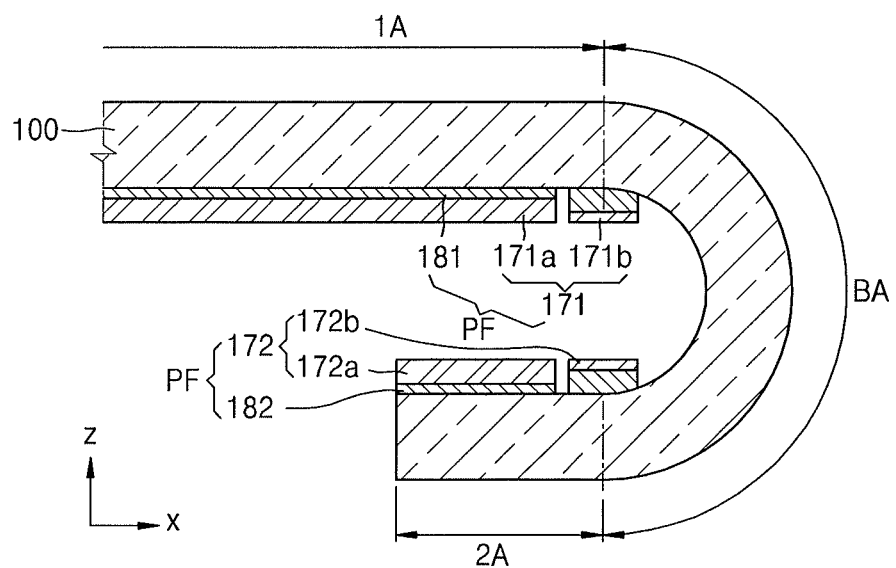
FIG. 12 illustrates another cross-sectional embodiment of a display apparatus.

FIG. 12 illustrates a schematic cross-sectional view of part of a display apparatus. In FIG. 12, the first protective film base 171 may not only be in the first area 1A and the second protective film base 172 may not only be in the second area 2A, but the first protective film base 171 and/or the second protective film base 172 may be partially located in the bending area BA. This may be intentional or may be a result of a miss-alignment between the protective film PF and the substrate 100.

However, according to the present embodiment, the first thin portion 171b in the first protective film base 171 may be closer to the center of the bending area BA than the first thick portion 171a having the sufficient thickness. Also, the second thin portion 172b in the second protective film base 172 is closer to the center of the bending area BA than the second thick portion 172a having the sufficient thickness. Accordingly, even if the first protective film base 171 and/or the second protective film base 172 is partially located in the bending area BA, the first thin portion 171b, not the first thick portion 171a, or the second thin portion 172b, not the second thick portion 172a, may be in the bending area BA.

Since the first thin portion 171b is thinner than the first thick portion 171a and the second thin portion 172b is thinner than the second thick portion 172a, the first thin portion 171b and the second thin portion 172b have relatively lower strengths and are more flexible. Therefore, even if the first protective film base 171 and/or the second protective film base 172 are partially in the bending area BA, the first thin portion 171b and/or the second thin portion 172b are in the bending area BA. Accordingly, separation of the first protective film base 171 and/or the second protective film base 172 from the substrate 100 or the damage on the substrate 100 may be effectively reduced or prevented. Moreover, since the first adhesive layer 181 or the second adhesive layer 182 including the PSA are relatively more flexible than the first protective film base 171 or the second protective film base 172, stress may be reduced through the first adhesive layer 181 or the second adhesive layer 182.

Figure 13:
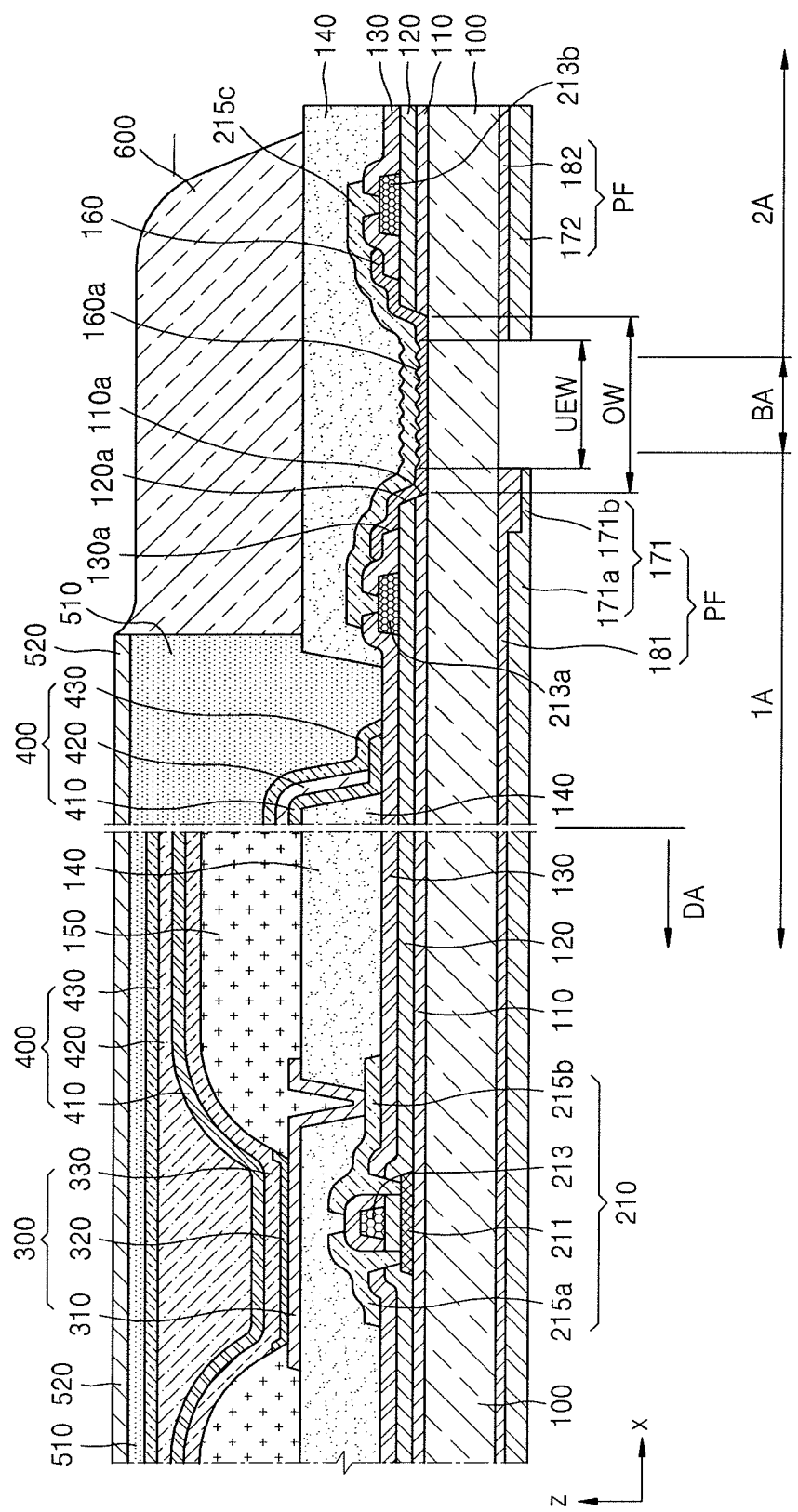
FIG. 13 illustrates another cross-sectional embodiment of a display apparatus.
Figure 14:
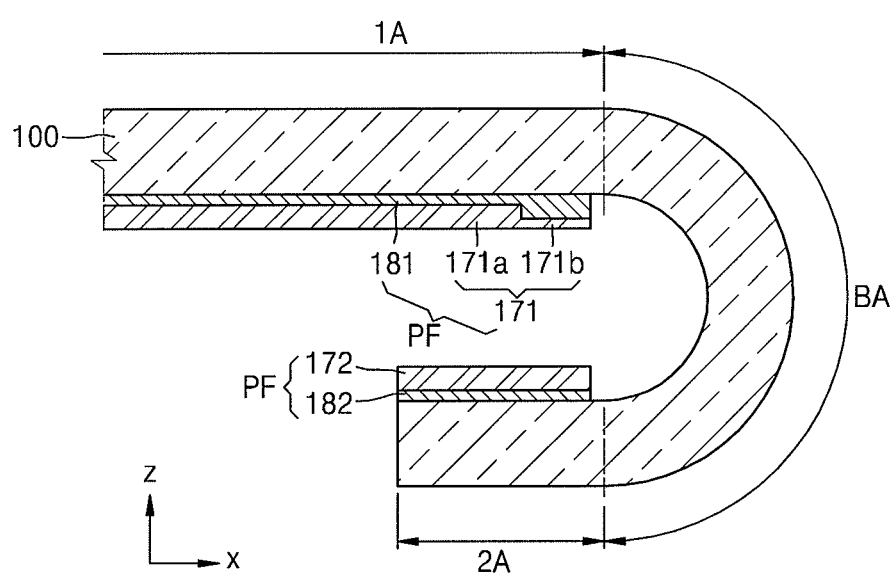
FIG. 14 illustrates another cross-sectional view the display apparatus in FIG. 13.

FIG. 13 illustrates a cross-sectional view of a part of a display apparatus according to another embodiment, and FIG. 14 illustrates a cross-sectional view of a part of the display apparatus of FIG. 13. The display apparatus of this embodiment is different from the display apparatus in FIGS. 5 and 6, in that the protective film PF includes the second protective film base 172 and the second adhesive layer 182, in addition to the first protective film base 171 and the first adhesive layer 181.

The second protective film base 172 is spaced apart from the first protective film base 171 and located above the lower surface of the substrate 100 to correspond to at least a part of the second area 2A. The second adhesive layer 182 is between the substrate 100 and the second protective film base 172 in order to fix the second protective film base 172 onto the substrate 100. As described above, when the protective film PF includes the second protective film base 172 and the second adhesive layer 182, more parts of the lower surface of the substrate 100 may be protected.

The second protective film base 172 may have a constant thickness as illustrated in FIGS. 13 and 14, unlike the first protective film base 171. This is because the second protective film base 172 is in the second area 2A that is the edge of the substrate 100, and there is no conductive layer that may be damaged or there are only a few conductive layers in the second area 2A.

Figure 15:
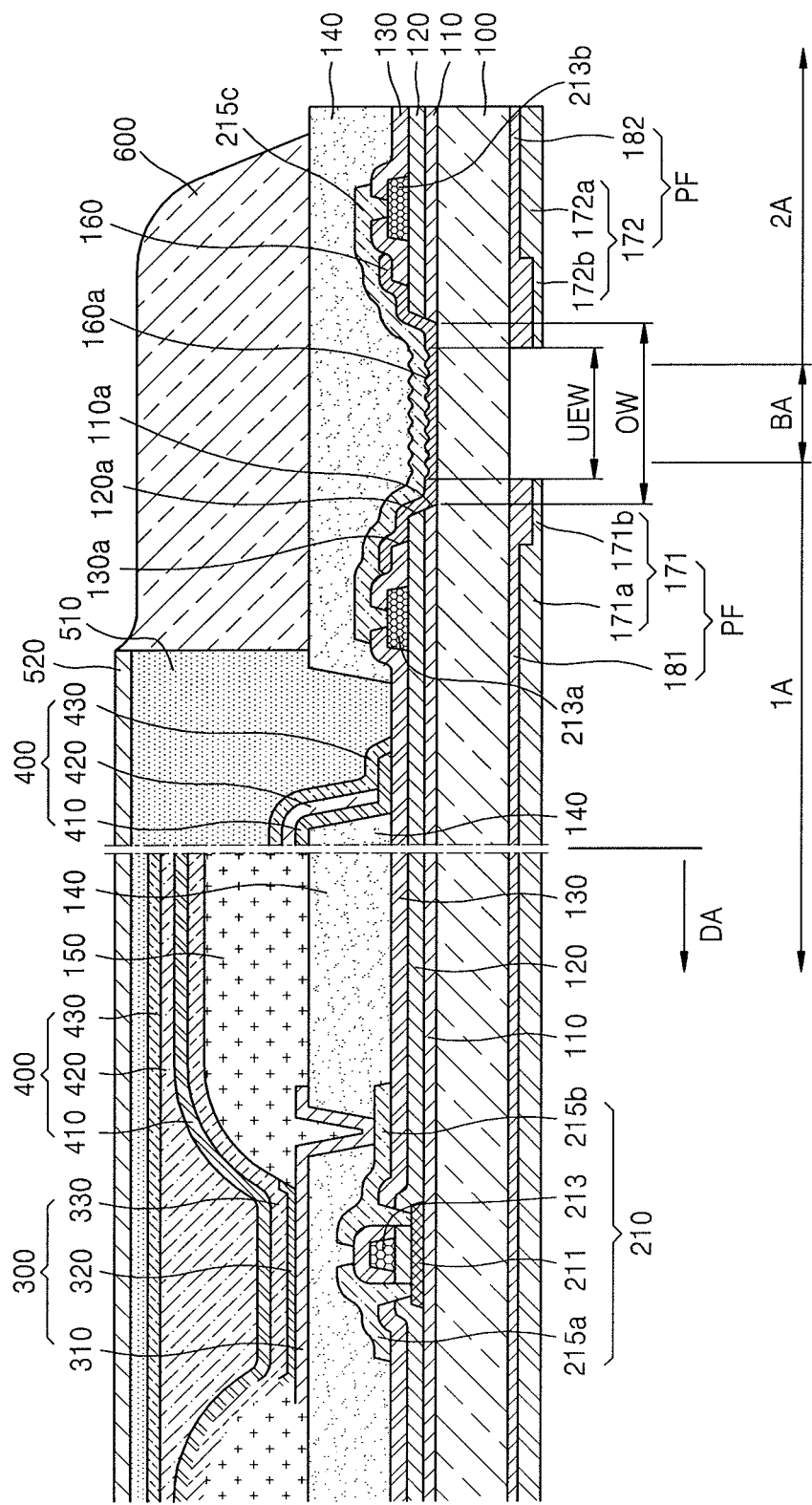
FIG. 15 illustrates another cross-sectional embodiment of a display apparatus.
Figure 16:
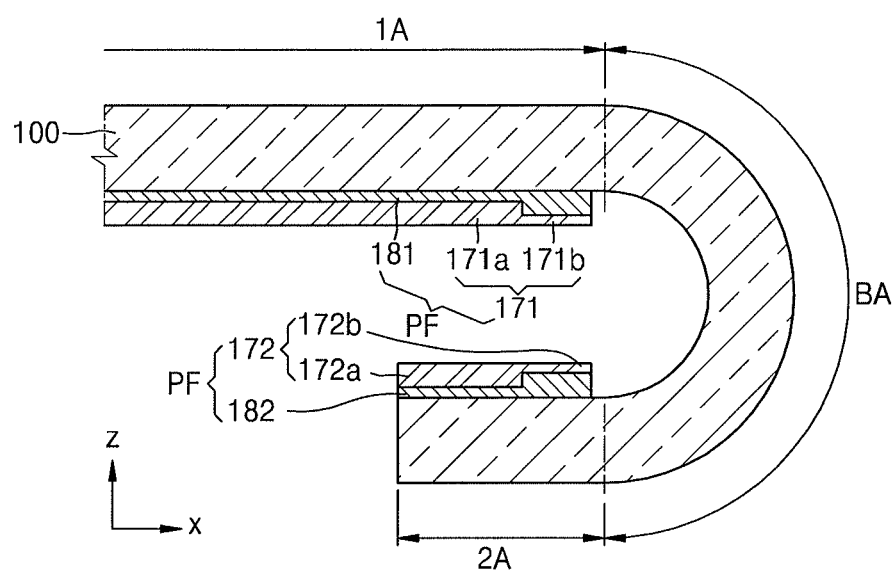
FIG. 16 illustrates another cross-sectional view of the display apparatus of FIG. 15.

FIG. 15 illustrates a cross-sectional view of a part of a display apparatus according to another embodiment, and FIG. 16 illustrates a cross-sectional view of a part of the display apparatus of FIG. 15. In FIGS. 15 and 16, the second protective film base 172 may include the second thick portion 172a having a third thickness and a second thin portion 172b closer to the bending area BA than the second thick portion 172a and having a fourth thickness less than the third thickness, similar to the first protective film base 171. The second thick portion 172a and the second thin portion 172b may contact or be integrally formed with each other.

Like the first protective film base 171, the second protective film base 172 of the protective film PF may have its own strength. Accordingly, if the second protective film base 172 has low flexibility, the second protective film base 172 may be separated from the substrate 100 when the substrate 100 is bent. Otherwise, the substrate 100 or the first conductive layer 215c above the substrate 100 may be damaged around the end of the second protective film base 172 in the direction toward the bending area BA due to the strength of the second protective film base 172.

However, in the present embodiment, the second protective film base 172 is in the second area 2A, not in the bending area BA. Thus, separation of the second protective film base 172 from the substrate 100 or damage on the substrate 100 may be effectively reduced or prevented.

Stress may be applied to the bending area BA or the portion of the second area 2A adjacent to the bending area BA, due to the bending of the bending area BA. However, according to the present embodiment, the second thin portion 172b in the second protective film base 172 is closer to the bending area BA than the second thick portion 172a, wherein the second thin portion 172b is thinner than the second thick portion 172a. Since the second thin portion 172b is thinner than the second thick portion 172a, the second thin portion 172b has relatively lower strength and is more flexible than the second thick portion 172a. Therefore, since the second thin portion 172b is closer to the bending area BA, separation of the second protective film base 172 from the substrate 100 or damage on the substrate 100 may be effectively reduced or prevented.

Figure 17:
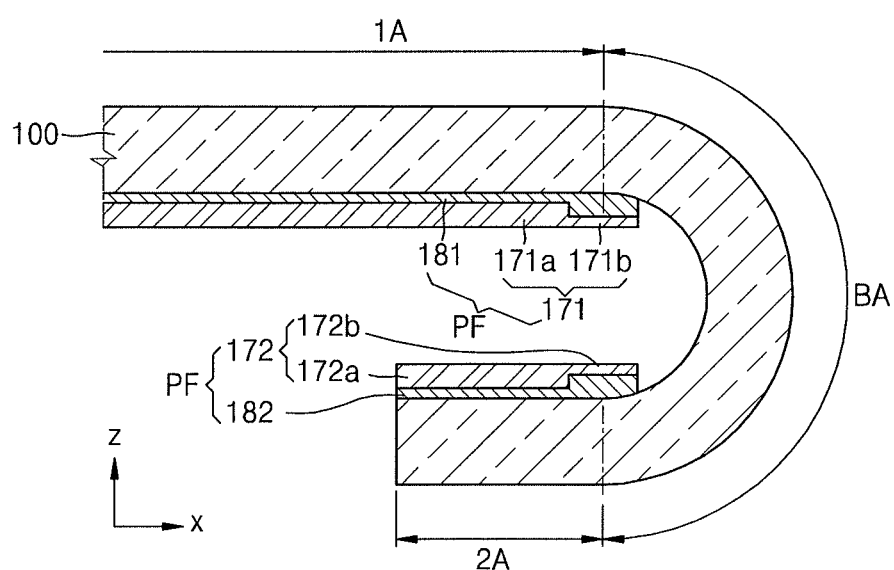
FIG. 17 illustrates another cross-sectional embodiment of a display apparatus.

FIG. 17 illustrates a cross-sectional view of a part of a display apparatus according to another embodiment. In FIG. 17, the first protective film base 171 may not only be located in the first area 1A and the second protective film base 172 may not only be located in the second area 2A, but the first protective film base 171 and/or the second protective film base 172 may be partially located in the bending area BA. This may be intentional or may be a result of miss-alignment between the protective film PF and the substrate 100.

However, according to the present embodiment, the first thin portion 171b in the first protective film base 171 is closer to the center of the bending area BA than the first thick portion 171a, wherein the first thin portion 171b is thinner than the first thick portion 171a. In addition, the second thin portion 172b in the second protective film base 172 is closer to the center of the bending area BA than the second thick portion 172a, wherein the second thin portion 172b is thinner than the second thick portion 172a. Accordingly, even if the first protective film base 171 and/or the second protective film base 172 is partially located in the bending area BA, the first thin portion 171b, not the first thick portion 171a, or the second thin portion 172b, not the second thick portion 172a, may be in the bending area BA.

Since the first thin portion 171b is thinner than the first thick portion 171a and the second thin portion 172b is thinner than the second thick portion 172a, the first thin portion 171b and the second thin portion 172b have relatively lower strength and are more flexible than the first thick portion 171a and the second thick portion 172a. Therefore, even if the first protective film base 171 and/or the second protective film base 172 is partially located in the bending area BA, the first thin portion 171b and/or the second thin portion 172b may be in the bending area BA. Accordingly, separation of the first and/or second protective film base 171 and 172 from the substrate 100 or damage on the substrate 100 may be effectively reduced or prevented.

Moreover, the first adhesive layer 181 or the second adhesive layer 182 including the PSA is more flexible than the first protective film base 171 or the second protective film base 172. Thus, stress may be reduced through the first adhesive layer 181 and the second adhesive layer 182.

In one or more previous embodiments, when the first protective film base 171 includes the first thick portion 171a and the first thin portion 171b and the first thick portion 171a and the first thin portion 171b are in contact or integrally formed, the thickness of the first protective film base 171 is changed discontinuously between the first thick portion 171a and the first thin portion 171b. In addition, when the second protective film base 172 includes the second thick portion 172a and the second thin portion 172b and the second thick portion 172a and the second thin portion 172b are in contact or integrally formed, the thickness of the second protective film base 172 is changed discontinuously between the second thick portion 172a and the second thin portion 172b. This may be different in other embodiments.

Figure 18:
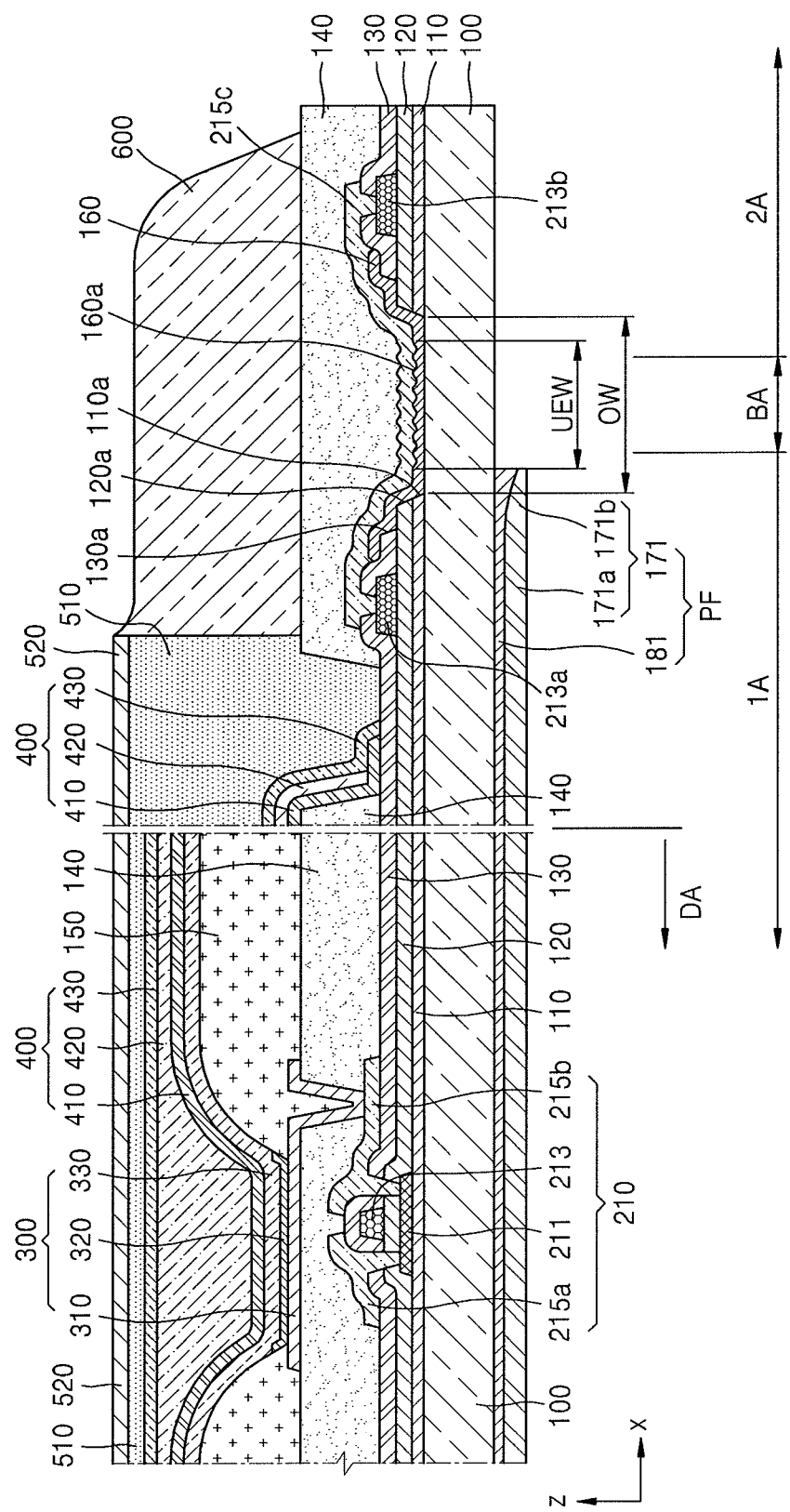
FIG. 18 illustrates another cross-sectional embodiment of a display apparatus.
Figure 19:
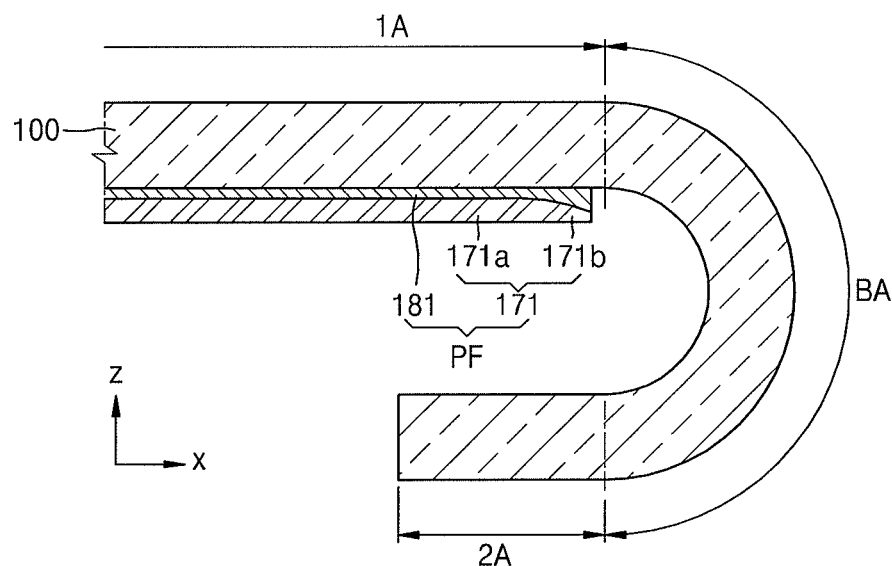
FIG. 19 illustrates another cross-sectional view of the display apparatus of FIG. 18.

FIG. 18 illustrates a cross-sectional view of a part of a display apparatus according to another embodiment, and FIG. 19 illustrates a cross-sectional view of part of the display apparatus that is bent. In FIGS. 18 and 19, the first protective film base 171 may include the first thick portion 171a and the first thin portion 171b and a first tapered portion having a thickness decreasing toward the bending area BA at an edge in the direction toward the bending area BA.

In the first tapered portion, the distance from the upper surface of the first protective film base 171 in the substrate 100 direction to the lower surface of the substrate 100 may increase toward the center portion of the bending area BA. Accordingly, in a portion of the first adhesive layer 181 corresponding to the first tapered portion, the distance from a lower surface of the first adhesive layer 181 in a direction toward the first protective film base 171 to the lower surface of the substrate 100 may increase toward the center portion of the bending area BA. In addition, in the first tapered portion, the distance from the lower surface of the first protective film base 171 to the lower surface of the substrate 100 may be constant toward the center portion of the bending area BA.

In one embodiment, the first protective film base 171 may be in the first area 1A, not in the bending area BA. Thus, separation of the first protective film base 171 from the substrate 100 or damage on the substrate 100 may be reduced or prevented. In addition, since the first protective film base 171 includes the first tapered portion that has a degree of the strength decreasing according to the thickness reduced toward the bending area BA and becomes more flexible. Accordingly, separation of the first protective film base 171 from the substrate 100 or damage on the substrate 100 may be effectively reduced or prevented.

Figure 20:
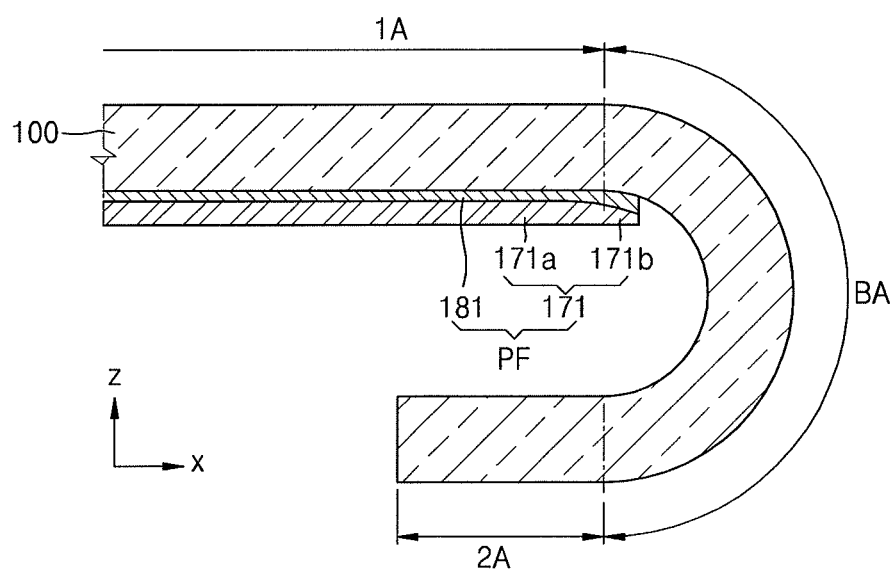
FIG. 20 illustrates another cross-sectional embodiment of a display apparatus.

FIG. 20 illustrates a cross-sectional view of a part of a display apparatus according to another embodiment. In FIG. 20, the first tapered portion of the first protective film base 171 may not only be located in the first area 1A, but may be partially located in the bending area BA. This may be intentional or may be a result of miss-alignment between the protective film PF and the substrate 100.

However, even if the first tapered portion is partially located in the bending area BA, the first tapered portion has the thickness decreasing toward the bending area BA and has the strength, the degree of which is lowered according to the thickness. Thus, the first tapered portion becomes more flexible toward the bending area BA. Accordingly, separation of the first protective film base 171 from the substrate 100 or damage on the substrate 100 may be effectively reduced or prevented. In addition, since the first adhesive layer 181 including the PSA is more flexible than the first protective film base 171, the stress may be reduced through the first adhesive layer 181.

Figure 21:
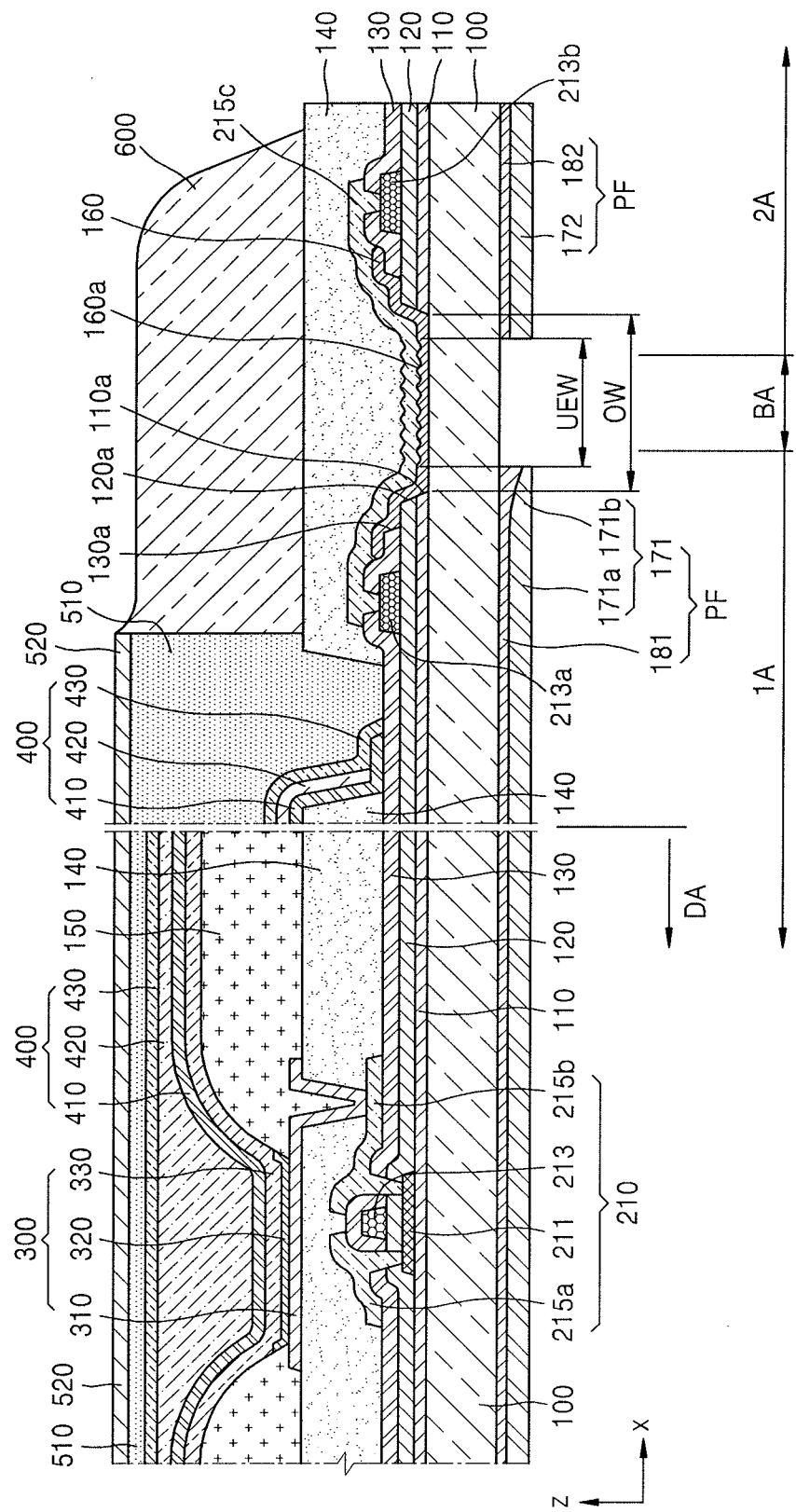
FIG. 21 illustrates another cross-sectional embodiment of a display apparatus.
Figure 22:
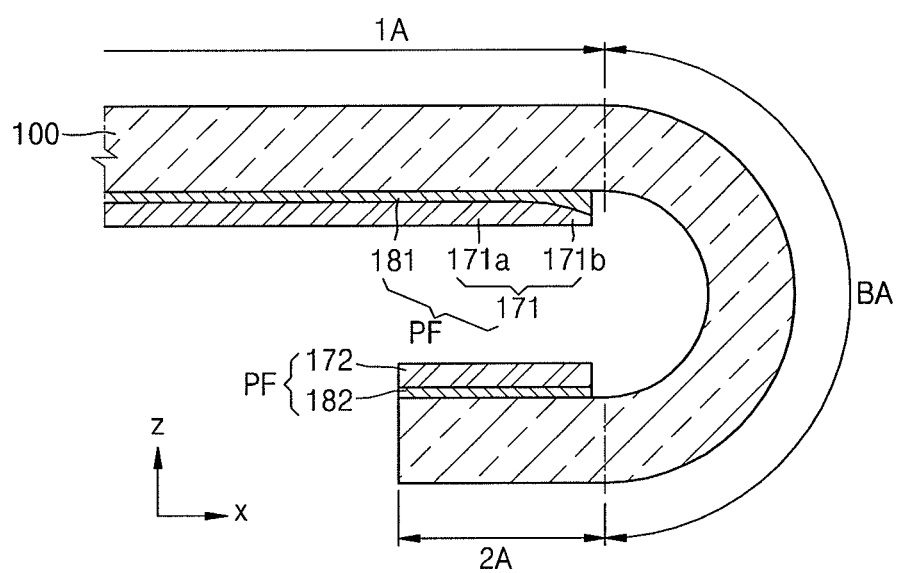
FIG. 22 illustrates another cross-sectional view of the display apparatus in FIG. 21.

FIG. 21 illustrates a cross-sectional view of a part of a display apparatus according to another embodiment, and FIG. 22 illustrates a cross-sectional view of part of the display apparatus in FIG. 21. The display apparatus according to this embodiment is different from the display apparatus in FIGS. 18 and 19 in that the protective film PF includes the second protective film base 172 and the second adhesive layer 182, in addition to the first protective film base 171 and the first adhesive layer 181.

The second protective film base 172 is spaced apart from the first protective film base 171 and located above the lower surface of the substrate 100 to correspond to at least a part of the second area 2A. The second adhesive layer 182 is between the substrate 100 and the second protective film base 172 in order to fix the second protective film base 172 onto the substrate 100. As described above, when the protective film PF includes the second protective film base 172 and the second adhesive layer 182, more parts on the lower surface of the substrate 100 may be protected.

Unlike the first protective film base 171, the second protective film base 172 may have a constant thickness as in FIGS. 21 and 22. This is because the second protective film base 172 is in the second area 2A, that is the edge of the substrate 100 where there is no conductive layer that may be damaged or there are only a few conductive layers in the second area 2A.

Figure 23:
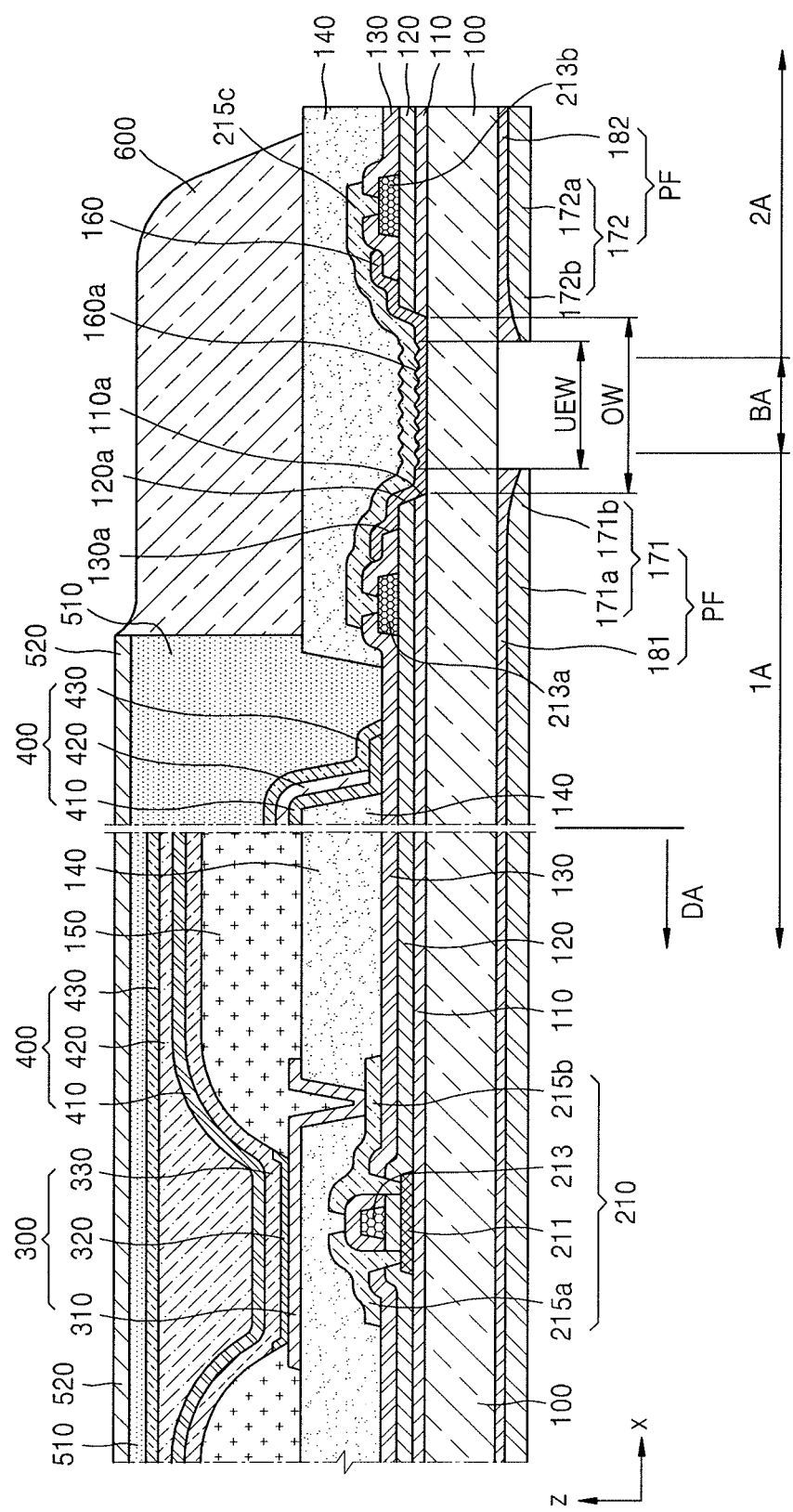
FIG. 23 illustrates another cross-sectional embodiment of a display apparatus.
Figure 24:
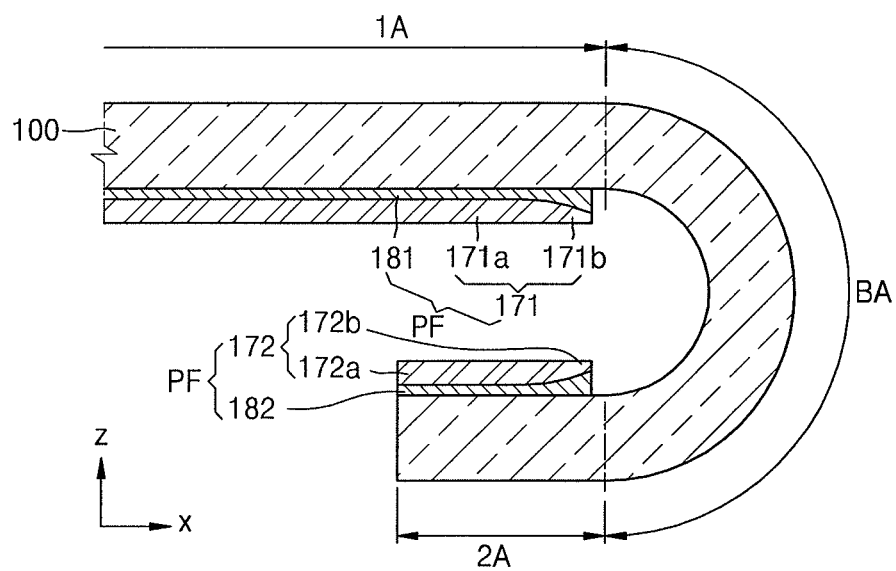
FIG. 24 illustrates another cross-sectional view of the display apparatus in FIG. 23.

FIG. 23 illustrates a cross-sectional view of a part of a display apparatus according to another embodiment, and FIG. 24 illustrates a cross-sectional view of part of the display apparatus in FIG. 23. In FIGS. 23, and 24, the second protective film base 172 may include the second thick portion 172a, the second thin portion 172b, and a second tapered portion having a thickness that decreases toward the bending area BA, similar to the first protective film base 171. The second protective film base 172 may be in the second area 2A.

In the second tapered portion, a distance from an upper surface of the second protective film base 172 in a direction toward the substrate 100 to the lower surface of the substrate 100 may increase toward the center portion of the bending area BA. Accordingly, in a portion of the second adhesive layer 182 corresponding to the second tapered portion, the distance from the lower surface of the second adhesive layer 182 in a direction toward the second protective film base 172 to the lower surface of the substrate 100 may increase toward the center portion of the bending area BA. In addition, in the second tapered portion, the distance from the lower surface of the second protective film base 172 to the lower surface of the substrate 100 may be constant toward the center portion of the bending area BA.

Like the first protective film base 171, the second protective film base 172 of the protective film PF may have its own strength. Accordingly, if the second protective film base 172 has a low flexibility, the second protective film base 172 may be separated from the substrate 100 when the substrate 100 is bent. Otherwise, the substrate 100 or the first conductive layer 215c above the substrate 100 may be damaged around the end of the second protective film base 172 in the direction toward the bending area BA, due to the strength of the second protective film base 172.

However, in the present embodiment, the second protective film base 172 is in the second area 2A, not in the bending area BA. Thus, separation of the second protective film base 172 from the substrate 100 or damage on the substrate 100 may be effectively reduced or prevented.

In particular, due to the bending at the bending area BA, stress may be applied to the bending area BA or the second area 2A adjacent to the bending area BA. However, in the present embodiment, the second protective film base 172 includes the second tapered portion having a thickness decreasing toward the bending area BA and a strength that is lowered and thus becomes more flexible. As a result, separation of the second protective film base 172 from the substrate 100 or damage on the substrate 100 may be effectively reduced or prevented.

Figure 25:
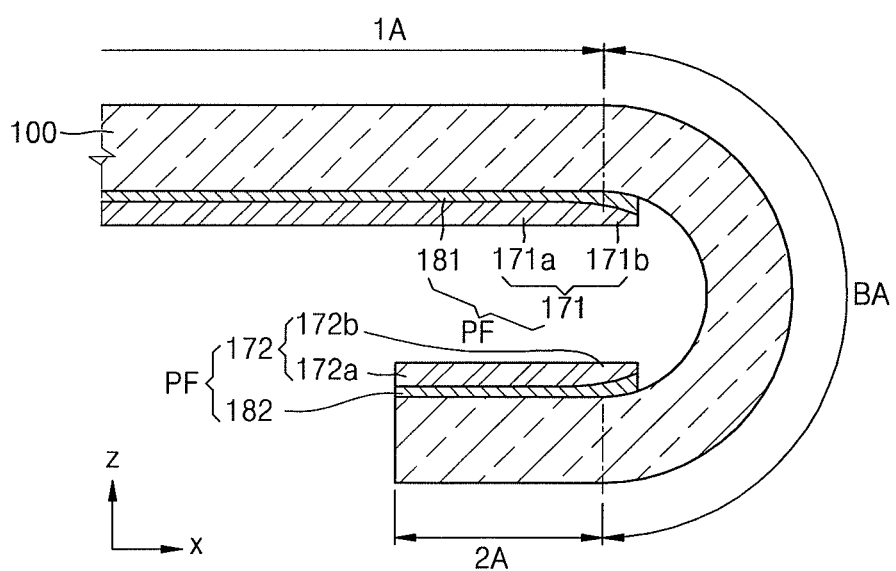
FIG. 25 illustrates another cross-sectional embodiment of a display apparatus.

FIG. 25 illustrates a cross-sectional view of a part of a display apparatus according to another embodiment. In FIG. 25, the first protective film base 171 may not only be located in the first area 1A and the second protective film base 172 may not only be located in the second area 2A, but the first protective film base 171 and/or the second protective film base 172 may be partially located in the bending area BA. This may be intentional or may be a result of miss-alignment between the protective film PF and the substrate 100.

However, even if the first tapered portion and/or the second tapered portion is partially located in the bending area BA, each of the first tapered portion and the second tapered portion has the thickness decreasing toward the bending area BA and has the strength, the degree of which is lowered according to the thickness. Thus, the first tapered portion or the second tapered portion becomes more flexible toward the bending area BA. Accordingly, separation of the first protective film base 171 and/or the second protective film base 172 from the substrate 100 or damage on the substrate 100 may be effectively reduced or prevented. In addition, since the first adhesive layer 181 or the second adhesive layer 182 including the PSA is more flexible than the first protective film base 171 or the second protective film base 172, stress may be reduced through the first adhesive layer 181 or the second adhesive layer 182 as well.

In addition, in FIG. 2 and other drawings for describing previous embodiments, the inorganic insulating layer of the display apparatus includes an opening corresponding to the bending area BA.

In other embodiments, the inorganic insulating layer may not include the opening that completely penetrates therethrough in the portion corresponding to the bending area BA, but may include a groove in the portion corresponding to the bending area BA. For example, the buffer layer 110 may be continuously formed throughout the first area 1A, the bending area BA, and the second area 2A.

In addition, the gate insulating layer 120 may include the opening 120a corresponding to bending area BA. The interlayer insulating layer 130 may also include the opening 130a corresponding to the bending area BA. Accordingly, the inorganic insulating layer including the buffer layer 110, the gate insulating layer 120, and the interlayer insulating layer

130 may be understood to have a groove corresponding to the bending area BA. However, the inorganic insulating layer may include the groove of various types. For example, an upper surface of the buffer layer 110 (in a +z direction) may be partially removed, but a lower surface of the gate insulating layer 120 (in a −z direction) may not be removed.

The groove may correspond to the bending area BA in the sense that the groove overlaps the bending area BA. An area of the groove may be greater than that of the bending area BA. The area of the groove may be defined as an area of one having the smallest area between the openings 120*a* and 130*a* of the gate insulating layer 120 and the interlayer insulating layer 130. As described above, when the inorganic insulating layer includes the groove, the organic material layer 160 may at least partially fill the groove. In addition, the first conductive layer 215*c* is on the organic material layer 160 within the area where the organic material layer 160 is formed.

The above description relating to the case in which the inorganic insulating layer includes the opening may be applied to the case in which the inorganic insulating layer includes the groove. For example, the organic material layer 160 may cover an inner side surface of the groove. In addition, the organic material layer 160 may include the uneven surface 160*a* at least partially in the upper surface thereof within the groove. In addition, in the bending area BA, the area of the uneven surface 160*a* of the organic material layer 160 may be greater than that of the bending area BA, but may be smaller than that of the groove. The structures or characteristics of the protective film PF may be applied to the display apparatus according to these embodiments.

Figure 26:
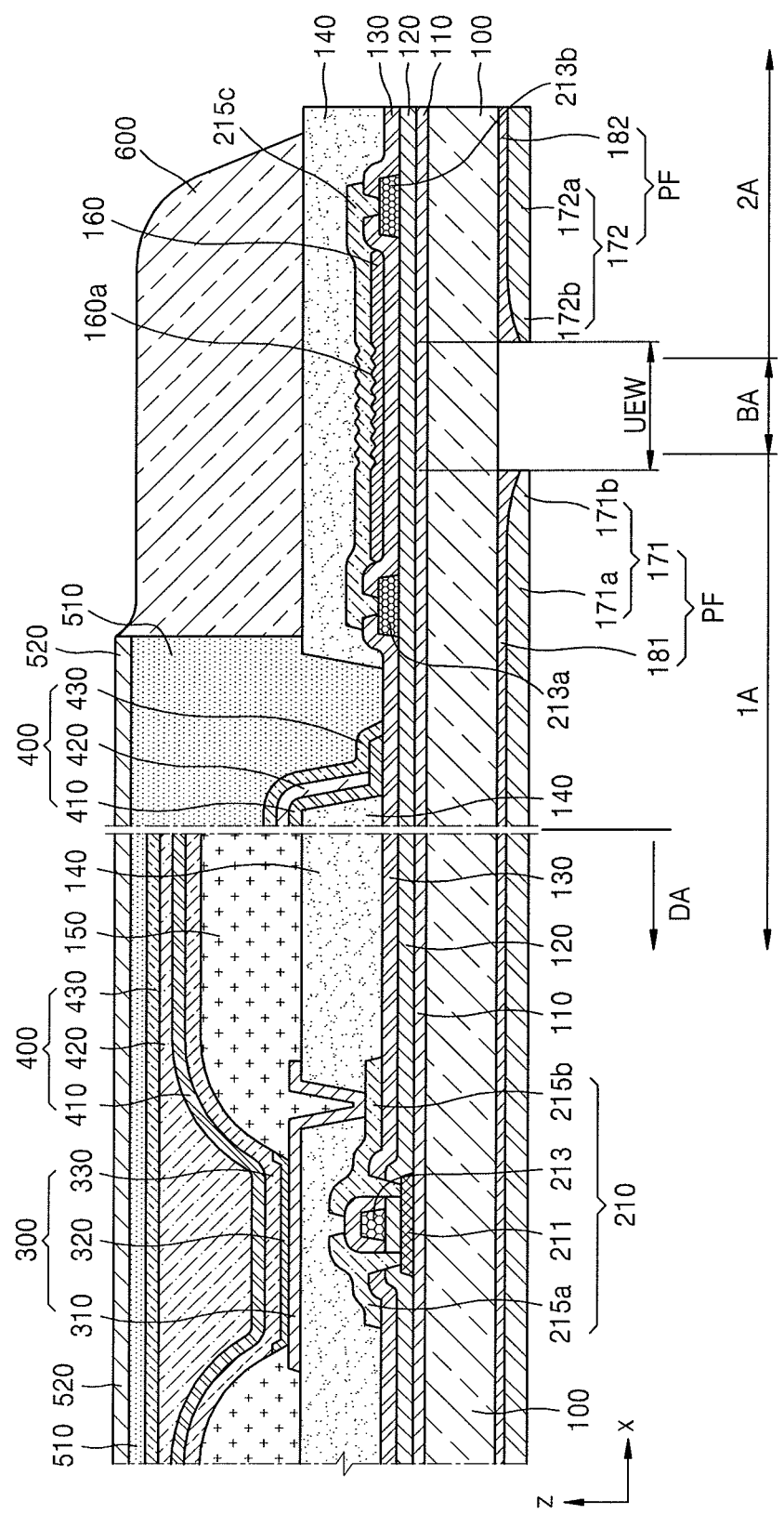
FIG. 26 illustrates another cross-sectional embodiment of a display apparatus.

FIG. 26 illustrates a cross-sectional view of a part of a display apparatus according to another embodiment. In FIG. 26, the buffer layer 110, the gate insulating layer 120, and the interlayer insulating layer 130 may be continuously provided throughout the first area 1A, the bending area BA, and the second area 2A. In addition, the organic material layer 160 is above the substrate 100 (e.g., the interlayer insulating layer 130) and may have the uneven surface 160*a* in the upper surface corresponding at least to the bending area BA. The structures and characteristics of the protective film PF according to the previously described embodiments may be applied to this embodiment.

Figure 27:
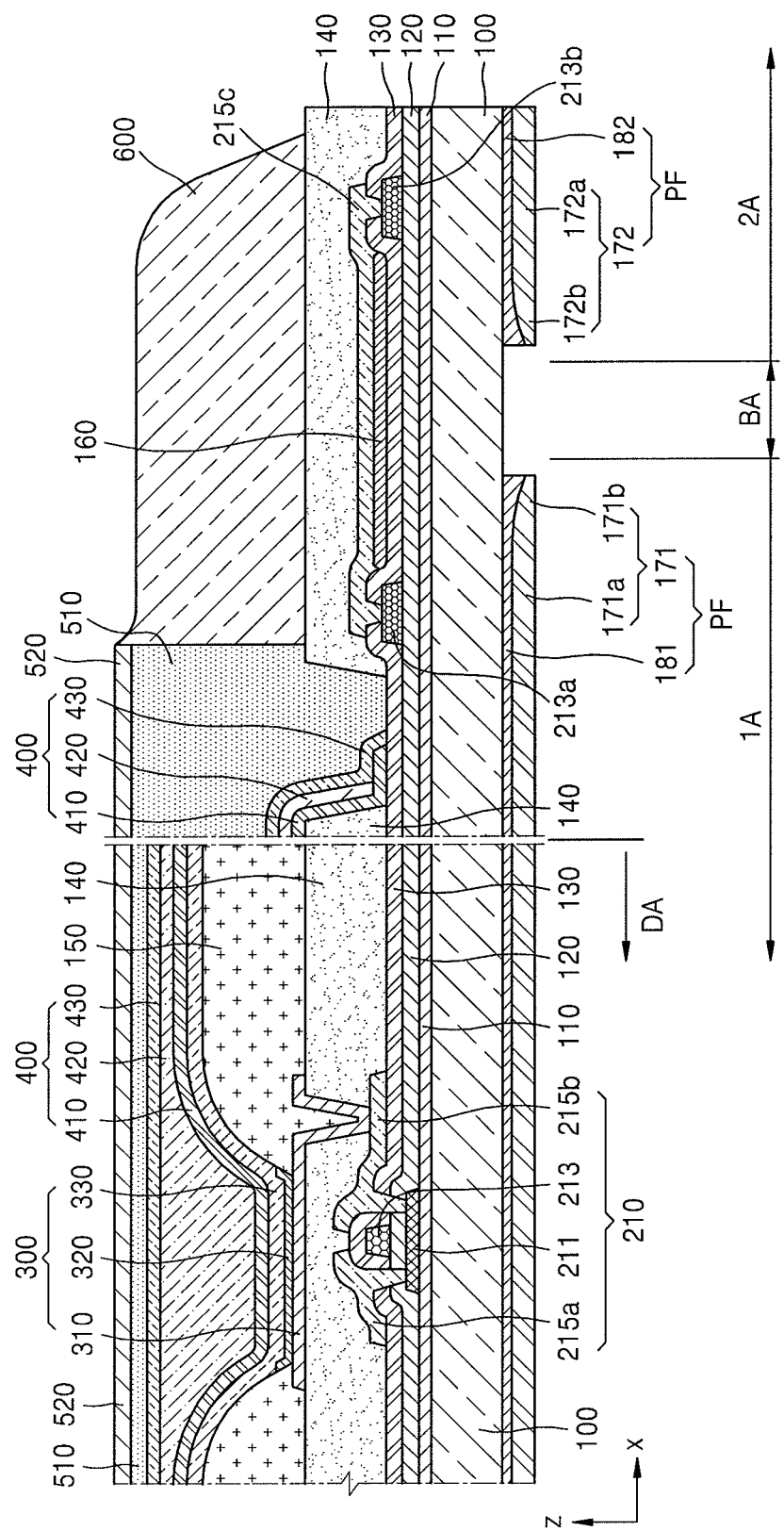
FIG. 27 illustrates another cross-sectional embodiment of a display apparatus.

FIG. 27 illustrates a cross-sectional view of a part of a display apparatus according to another embodiment. In FIG. 27, the structures and characteristics of the protective film PF according to the previously described embodiments may be applied to a case in which the organic material layer 160 does not include the uneven surface 160*a* in the upper surface thereof. Also, the structures and characteristics of the protective film PF according to the previously described embodiments may be applied to a case in which the organic material layer 160 is not provided.

According to the one or more embodiments, the defect ratio corresponding to a process for manufacturing a display device may be reduced.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the embodiments set forth in the claims.

What is claimed is:

1. A display apparatus, comprising:
   a substrate including a bending area between a first area and a second area and bent about a bending axis;
   a display over an upper surface of the substrate in the first area; and
   a protective film over a lower surface of the substrate, the protective film including a first protective film base over the lower surface of the substrate and corresponding to at least a part of the first area and a first adhesive layer between the substrate and the first protective film base,
   wherein the first protective film base includes a first thick portion having a first thickness and a first thin portion having a second thickness less than the first thickness and closer to the bending area than the first thick portion, and
   wherein, in the first adhesive layer, a thickness of a portion corresponding to the first thin portion is greater than a thickness of a portion corresponding to the first thick portion.

2. The display apparatus as claimed in claim 1, wherein the first thick portion is spaced from the first thin portion.

3. The display apparatus as claimed in claim 1, wherein the first thick portion and the first thin portion are integral with each other.

4. A display apparatus, comprising:
   a substrate including a bending area between a first area and a second area and bent about a bending axis;
   a display over an upper surface of the substrate in the first area; and
   a protective film over a lower surface of the substrate, the protective film including a first protective film base over the lower surface of the substrate and corresponding to at least a part of the first area and a first adhesive layer between the substrate and the first protective film base,
   wherein the first protective film base includes a first thick portion having a first thickness and a first thin portion having a second thickness less than the first thickness and closer to the bending area than the first thick portion, and
   wherein the first protective film base includes a first tapered portion that includes the first thick portion and the first thin portion, the first tapered portion having a thickness decreasing toward the bending area at an edge of the first protective film base in a direction toward the bending area.

5. The display apparatus as claimed in claim 4, wherein a distance from an upper surface of the first protective film base in a direction toward the substrate to the lower surface of the substrate increases, from the first tapered portion toward the bending area.

6. The display apparatus as claimed in claim 5, wherein a distance from a lower surface of the first protective film base to the lower surface of the substrate is constant, from the first tapered portion to the bending area.

7. The display apparatus as claimed in claim 5, wherein a distance from a lower surface of the first adhesive layer in a direction toward the first protective film base to the lower surface of the substrate increases, from a portion of the first adhesive layer, which corresponds to the first tapered portion, to the bending area.

8. The display apparatus as claimed in claim 4, wherein the first tapered portion is in the first area.

9. The display apparatus as claimed in claim 1, wherein the protective film further includes:
- a second protective film base spaced from the first protective film base and over the lower surface of the substrate in correspondence with at least a part of the second area, and
- a second adhesive layer between the substrate and the second protective film base.

10. The display apparatus as claimed in claim 9, wherein the second protective film base has a constant thickness.

11. The display apparatus as claimed in claim 9, wherein the second protective film base includes:
- a second thick portion having a third thickness; and
- a second thin portion having a fourth thickness less than the third thickness and closer to the bending area than the second thick portion.

12. The display apparatus as claimed in claim 11, wherein the second thick portion is spaced from the second thin portion.

13. The display apparatus as claimed in claim 11, wherein the second thick portion and the second thin portion are integral with each other.

14. The display apparatus as claimed in claim 11, wherein, in the second adhesive layer, a thickness of a portion corresponding to the second thin portion is greater than a thickness of a portion corresponding to the second thick portion.

15. The display apparatus as claimed in claim 11, wherein the second protective film base includes a second tapered portion that includes the second thick portion and the second thin portion, the second tapered portion having a thickness decreasing toward the bending area at an edge of the second protective film base in a direction toward the bending area.

16. The display apparatus as claimed in claim 15, wherein a distance from an upper surface of the second protective film base in a direction toward the substrate to the lower surface of the substrate increases, from the second tapered portion toward the bending area.

17. The display apparatus as claimed in claim 16, wherein a distance from a lower surface of the second protective film base to the lower surface of the substrate is constant, from the second tapered portion to the bending area.

18. The display apparatus as claimed in claim 16, wherein a distance from a lower surface of the second adhesive layer in a direction toward the second protective film base to the lower surface of the substrate increases, from a portion of the second adhesive layer, which corresponds to the second tapered portion, to the bending area.

19. The display apparatus as claimed in claim 15, wherein the second tapered portion is in the second area.

20. A display apparatus, comprising:
- a substrate including a bending area between a first area and a second area and bent about a bending axis;
- a display over an upper surface of the substrate in the first area; and
- a protective film over a lower surface of the substrate, the protective film including:
  - a first protective film base over the lower surface of the substrate and corresponding to at least a part of the first area,
  - a first adhesive layer between the substrate and the first protective film base,
  - a second protective film base spaced from the first protective film base and over the lower surface of the substrate in correspondence with at least a part of the second area, and
  - a second adhesive layer between the substrate and the second protective film base,
- wherein the first protective film base includes a first thick portion having a first thickness and a first thin portion having a second thickness less than the first thickness and closer to the bending area than the first thick portion.

* * * * *